US 11,170,143 B2

(12) United States Patent
Peiret Gimenez et al.

(10) Patent No.: US 11,170,143 B2
(45) Date of Patent: Nov. 9, 2021

(54) SYSTEMS AND METHODS FOR SIMULATING MULTIBODY SYSTEMS

(71) Applicant: CMLABS SIMULATIONS INC., Montreal (CA)

(72) Inventors: Albert Peiret Gimenez, Montreal (CA); Sheldon Paul Andrews, Ottawa (CA); Jozsef Kovecses, Saint-Bruno (CA); Paul Gregory Kry, Montreal (CA); Marek Teichmann, Mont-Royal (CA)

(73) Assignee: CMLABS SIMULATIONS INC., Montreal (CA)

( * ) Notice: Subject to any disclaimer, the term of this patent is extended or adjusted under 35 U.S.C. 154(b) by 456 days.

(21) Appl. No.: 16/165,503

(22) Filed: Oct. 19, 2018

(65) Prior Publication Data
US 2020/0125688 A1    Apr. 23, 2020

(51) Int. Cl.
*G06F 17/12* (2006.01)
*G06F 30/23* (2020.01)
*G06F 30/15* (2020.01)
*G06F 30/28* (2020.01)

(52) U.S. Cl.
CPC .............. *G06F 30/23* (2020.01); *G06F 17/12* (2013.01); *G06F 30/15* (2020.01); *G06F 30/28* (2020.01)

(58) Field of Classification Search
CPC .......... G06F 30/23; G06F 17/12; G06F 30/15; G06F 30/28
USPC ........................................................... 703/2
See application file for complete search history.

(56) References Cited

U.S. PATENT DOCUMENTS

| 7,079,145 B2 * | 7/2006 | Tonge | G06T 19/00 345/473 |
|---|---|---|---|
| 2009/0228244 A1 * | 9/2009 | Naudet | G06F 30/20 703/2 |
| 2020/0125688 A1 | 4/2020 | Peiret et al. | |

OTHER PUBLICATIONS

Tournier, Maxime, et al. "Stable Constrained Dynamics." ACM Transactions on Graphics, vol. 34, No. 4, 2015, pp. 1-10., doi: 10.1145/2766969. (Year: 2015).*
Moreau, "Quadratic Programming in Mechanics: Dynamics of One-sided Constraints", SIAM Journal on Control and Optimization, Society for Industrial and Applied Mathematics, 1966, vol. 4, No. 1, pp. 153-158.
Cuthill et al., "Reducing the Bandwith of Sparce Symmetric Matrices", Proceedings of the 1969 24th national conference, 1969, pp. 157-172.

(Continued)

*Primary Examiner* — Kamini S Shah
*Assistant Examiner* — John E Johansen
(74) *Attorney, Agent, or Firm* — BCF LLP

(57) ABSTRACT

Methods and systems for executing a simulation of a multibody system are described herein. In one broad aspect, there is provided a computer-implemented method for executing a simulation of a multibody system, where a physics-based simulator is used to simulate the multibody system by: partitioning the multibody system into a plurality of subsystems, the multibody system comprising bilateral and unilateral constraints, and a set of interfaces that couple at least two of the subsystems is defined; at each of a plurality of time steps, employing a Schur complement method to compute an effective mass at each interface of the set of interfaces, and solving each of the plurality of subsystems to obtain a plurality of internal impulses.

19 Claims, 13 Drawing Sheets

(56) References Cited

OTHER PUBLICATIONS

Anitescu et al., "Formulating Dynamic Multi-Rigid-body Contact Problems with Friction as Solvable Linear Complementarity Problems", Nonlinear Dynamics, 1997, vol. 14, No. 3, pp. 231-247.
Anitescu et al., "Formulating Dynamic Multi-Rigid-body Contact Problems with Friction as Solvable Linear Complementarity Problems", Reports on Computational Mathematics, Dept. of Mathematics, University of Iowa,1996, No. 93, pp. 1-21.
Pellegrini et al., "Scotch: A Software Package for Static Mapping by Dual Recursive Bipartitioning of Process and Architecture Graphs", High-Performance Computing and Networking: International Conference and Exhibition HPCN Europe, 1996, pp. 493-498.
Stewart et al., "An Implicit Time-Stepping Scheme for Rigid Body Dynamics with ICoulomb Friction", International Journal for Numerical Methods in Engineering, 1996, vol. 39, No. 15, pp. 2673-2691.
O'Leary, "A Generalized Conjugate Gradient Algorithm for Solving a Class of Quadratic Programming Problems", Linear Algebra and its Applications, 1980, vol. 34, pp. 371-399.
Judice et al., "A Block Principal Pivoting Algorithm for Large-scale Strictly Monotone Linear Complementarity Problems", Computers & Operations Research, 1994, vol. 21, No. 5, pp. 587-596.
Baraff, "Fast Contact Force Computation for Nonpenetrating Rigid Bodies", Computer Graphics Proceedings, Annual Conference Series, 1994, pp. 23-34.
Baraff, "Linear-Time Dynamics using Lagrange Multipliers", Computer Graphics Proceedings, Annual Conference Series, 1996, pp. 137-146.
Baraff et al., "Partitioned Dynamics", The Robotics Institut Carnegie Mellon University, 1997, pp. 1-14.
Karypis et al., "A Fast and High Quality Multilevel Scheme for Partitioning Irregular Graphs", SIAM Journal on Scientific Computing, 1998, vol. 20, No. 1, pp. 359-392.
Featherstone, "A Divide and Conquer Articulated Body Algorithm for Parallel O(log(n)) Calculation of Rigid-Body Dynamics. Part 1: Basic Algorithm", The International Journal of Robotics Research, 1999, vol. 18, No. 9, pp. 867-875.
Featherstone, "A Divide-and-Conquer Articulated-Body Algorithm for Parallel O(log(n)) Calculation of Rigid-Body Dynamics. Part 2: Trees, Loops and Accuracy", The International Journal of Robotics Research, 1999, vol. 18, No. 9, pp. 876-892.
Glocker, "Set-Valued Force Laws: Dynamics of Non-Smooth Systems. Lecture Notes in Applied Mechanics 1" (book; ISBN 3-540-41436-3 Springer Verlag Berlin Heidelberg New York, 222 pages), Springer Verlag, 2001, contents—7 pages.
Kim, "A Subsystem Synthesis Method for Efficient Vehicle Multibody Dynamics", Multibody System Dynamics, 2002, vol. 7, pp. 189-207.
Cline et al., "Post-Stabilization for Rigid Body Simulation with Contact and Constraints", Proceedings IEEE International Conference on Robotics and Automation, 2003, vol. 3, pp. 3744-3751.
Guendelman et al., "Nonconvex Rigid Bodies with Stacking", ACM Trans Graph., 2003, vol. 22, No. 3, pp. 871-878.
Pfeiffer et al., "Numerical Aspects of Non-smooth Multibody Dynamics", Computer Methods in Applied Mechanics and Engineering, 2006, vol. 195, pp. 6891-6908.
Erleben, "Velocity-Based Shock Propagation for Multibody Dynamics Animation", ACM Transactions on Graphics, 2007, vol. 26, No. 2, Article 12, pp. 1-20.
Lacoursiere, "A Parallel Block Iterative Method for Interactive Contacting Rigid Multibody Simulations on Multicore PCs", Applied Parallel Computing: State of the Art in Scientific Computing (PARA 2006), Lecture Notes in Computer Science (LNCS) 4699, 2007, 4 pages.

Acary et al., "Lecture Notes in Applied and Computational Mechanics, Numerical Methods for Nonsmooth Dynamical Systems, Applications in Mechanics and electronics, vol. 35" (book), Springer, 2008, 525 pages.
Kaufman et al., "Staggered Projections for Frictional Contact in Multibody Systems", ACM Transactions on Graphics, 2008, vol. 27, No. 5, Article 164, pp. 1-11.
Critchley et al., "An Efficient Multibody Divide and Conquer Algorithm and Implementation", Journal of Computational and Nonlinear Dynamics, 2009, vol. 4, 10 pages.
Barbic et al., "Real-time Large-deformation Substructuring", ACM Transactions on Graphics, 2011, vol. 30, No. 4, Article No. 91, 8 pages.
Kim et al., "Physics-based Character Skinning using Multi-Domain Subspace Deformations", Symposium on Computer Animation, 2011, pp. 63-72.
Narain et al., "Adaptive Anisotropic Remeshing for Cloth Simulation", ACM Transactions on Graphics, 2012, vol. 31, No. 6, Article 152, 10 pages.
Tonge et al., "Mass Splitting for Jitter-Free Parallel Rigid Body Simulation", ACM Transactions on Graphics, 2012, Vo. 31, No. 4, pp. 1-8.
Visseq et al., "Dense Granular Dynamics Analysis by a Domain Decomposition Approach", Computational Mechanics, 2012, vol. 49, No. 6, 26 pages.
Laflin et al., "Advances in the Application of the Divide-and-Conquer Algorithm to Multibody System Dynamics", Journal of Computational and Nonlinear Dynamics, 2014, vol. 9, 8 pages.
Kang et al., "Parallel Processing with the Subsystem Synthesis Method for Efficient Vehicle Analysis", Journal of Mechanical Science and Technology, 2015, vol. 29, No. 7, pp. 2663-2669.
Mazhar et al., "Using Nesterov's Method to Accelerate Multibody Dynamics with Friction and Contact", ACM Transactions on Graphics, 2015, vol. 34, No. 3, Article 32, 14 pages.
Fratarcangeli et al., "Vivace: a Practical Gauss-Seidel Method for Stable Soft Body Dynamics", ACM Transactions on Graphics, 2016, vol. 35, No. 6, Article 214, 9 pages.
Chu et al., "A Schur Complement Preconditioner for Scalable Parallel Fluid Simulation", ACM Transactions on Graphics, 2017, vol. 36, No. 5, Article 163, 11 pages.
Muller et al., "Long Range Constraints for Rigid Body Simulations", Eurographics Symposium on Computer Animation, 2017, 10 pages.
Deul et al., "Direct Position-Based Solver for Stiff Rods", Computer Graphics forum, 2018, vol. 37, No. 6, pp. 313-324.
Enzenhofer et al., "Comparison of Mixed Linear Complementarity Problem Solvers for Multibody Simulations with Contact", Workshop on Virtual Reality Interaction and Physical Simulation, 2018, 10 pages.
Haixiang et al., "A Scalable Schur-complement Fluids Solver for Heterogeneous Compute Platforms", ACM Transactions on Graphics, 2016, vol. 35, No. 6, Article 201, 12 pages.
Silcowitz et al., "Interactive Rigid Body Dynamics Using a Projected Gauss-Seidal Subspace Minimization Method", article in the book "Computer Vision, Imaging and Computer Graphics, Theory and Applications", International Joint Conference VISIGRAPH, 2010, 12 pages.
Richard et al., "Computer Vision, Imaging and Computer Graphics, Theory and Applications" (book), International Joint Conference VISIGRAPH, 2010, 327 pages.
Peiret et al., "Schur Complement-based Substructuring of Stiff Multibody Systems with Contact", ACM Transactions on Graphics, vol. 38, No. 5, Article 150, Oct. 2019, 17 pages.

* cited by examiner

SYSTEMS AND METHODS FOR SIMULATING MULTIBODY SYSTEMS

FIELD

Embodiments described herein relate generally to systems and methods for executing multibody simulations, and more specifically to improved physics-based simulators in which scenarios involving physical systems describable with multibody system models composed of rigid bodies are simulated.

BACKGROUND

Physics-based simulations play an important role in computer graphics, robotics simulation, virtual reality, training simulations, video games, film special effects, and many other applications. Various physical systems can be described with multibody system models that are composed of rigid bodies. These rigid bodies model the physical components. The connections among these components are represented by constraints and force models. A typical model includes both bilateral and unilateral constraints as well as friction at the contact interfaces.

SUMMARY

In one broad aspect, there is provided a computer-implemented method and computer-based system for executing a simulation of a multibody system, where a physics-based simulator is used to simulate the multibody system by: partitioning the multibody system into a plurality of subsystems, the multibody system comprising bilateral and unilateral constraints, and a set of interfaces that couple at least two of the subsystems is defined; at each of a plurality of time steps, employing a Schur complement method to compute an effective mass at each interface of the set of interfaces, and solving each of the plurality of subsystems to obtain a plurality of internal impulses.

In another broad aspect, there is provided a computer-implemented method for executing a simulation of a multibody system, the method comprising: using a physics-based simulator comprising at least one processor and memory, simulating the multibody system, wherein the simulating comprises: partitioning the multibody system into a plurality of subsystems, wherein the multibody system comprises bilateral and unilateral constraints, and wherein a set of interfaces that couple at least two of the subsystems is defined; and at each time step of a plurality of time steps, each time step comprising at least one iteration, determining an index set that identifies a set of active constraints in the plurality of subsystems, wherein the set of active constraints is usable in a formulation of dynamic equations for the set of interfaces; at each interface of the set of interfaces, computing an effective mass that accounts for at least a subset of bodies of the plurality of subsystems and for at least a portion of a topology and of an interconnectivity structure between the bodies of the plurality of subsystems; solving the dynamic equations of each interface of the set of interfaces, and computing at least one interface impulse for each interface using the effective mass; and solving dynamic equations of each of the plurality of subsystems to obtain a plurality of internal impulses.

In another broad aspect, when computing the effective mass, the effective mass accounts for all bodies of the plurality of subsystems, a complete topology, and a complete interconnectivity structure between the bodies of the plurality of subsystems.

In another broad aspect, the simulating further comprises outputting a sequence of images for display, the sequence of images reflecting simulated positions and orientations of objects of the multibody system for at least a subset of the plurality of time steps.

In another broad aspect, at least one of the plurality of subsystems is solved in parallel with at least one other of the plurality of subsystems by the at least one processor, at each time step.

In another broad aspect, a Schur complement method is used in the formulation of dynamic equations for the set of interfaces.

In another broad aspect, the Schur complement method is used in the formulation of dynamic equations for the set of interfaces, by computing the effective mass at each interface of the set of interfaces by forming the inverse effective mass of each of the plurality of subsystems; and solving for the at least one interface impulse.

In another broad aspect, for each time step over the at least one iteration thereof, the solving for the at least one interface impulse and the solving each of the plurality of subsystems are alternatingly performed.

In another broad aspect, at least one of the solvers selected from the following group is used to solve for the at least one interface impulse: block principal pivoting, projected Gauss-Seidel with subspace minimization.

In another broad aspect, the simulating further comprises identifying one or more indices for the set of active constraints, and generating at least one index set of internal subsystem constraints for computing the effective mass at each interface.

In another broad aspect, the simulating further comprises, for each iteration of the at least one iteration: generating one or more new index sets of internal subsystem constraints; where at the iteration, one or more index sets generated in a previous iteration are used to compute the effective mass at the plurality of interfaces.

In another broad aspect, for a given time step, the solving each interface and the solving each of the plurality of subsystems terminate when the new index sets are unchanged from the one or more index sets generated in the previous iteration.

In another broad aspect, the partitioning the multibody system into a plurality of subsystems comprises executing a minimum degree partitioning method.

In another broad aspect, the partitioning the multibody system into a plurality of subsystems is performed using semantic partitioning.

In another broad aspect, the multibody system comprises a stiff multibody system.

In another broad aspect, the simulation of the multibody systems is performed by the physics-based simulator for an equipment training simulation.

In another broad aspect, the simulation of the multibody systems is performed by the physics-based simulator for a robotics simulation.

In another broad aspect, the simulation of the multibody systems is performed by the physics-based simulator for a virtual reality application.

In another broad aspect, the simulation of the multibody systems is performed by the physics-based simulator for an engineering design application.

In another broad aspect, there is provided a computer-implemented system for executing a simulation of a multibody system, the computer-implemented system comprising a physics-based simulator, the physics-based simulator comprising: at least one processor and a non-transitory computer-readable medium, the non-transitory computer-readable medium comprising control logic which, upon execution by the at least one processor, causes the physics-based simulator to simulate the multibody system by: partitioning the multibody system into a plurality of subsystems, wherein the multibody system comprises bilateral and unilateral constraints, and wherein a set of interfaces that couple at least two of the subsystems is defined; and at each time step of a plurality of time steps, each time step comprising at least one iteration, determining an index set that identifies a set of active constraints in the plurality of subsystems, wherein the set of active constraints is usable in a formulation of dynamic equations for the set of interfaces; at each interface of the set of interfaces, computing an effective mass that accounts for at least a subset of bodies of the plurality of subsystems and for at least a portion of a topology and of an interconnectivity structure between the bodies of the plurality of subsystems; solving the dynamic equations of each interface of the set of interfaces, and computing at least one interface impulse for each interface using the effective mass; and solving dynamic equations of each of the plurality of subsystems to obtain a plurality of internal impulses.

In another broad aspect, there is provided a non-transitory computer-readable medium, the non-transitory computer-readable medium comprising control logic which, upon execution by a processor, causes: a physics-based simulator engine to simulate a multibody system by: partitioning the multibody system into a plurality of subsystems, wherein the multibody system comprises bilateral and unilateral constraints, and wherein a set of interfaces that couple at least two of the subsystems is defined; and at each time step of a plurality of time steps, each time step comprising at least one iteration, determining an index set that identifies a set of active constraints in the plurality of subsystems, wherein the set of active constraints is usable in a formulation of dynamic equations for the set of interfaces; at each interface of the set of interfaces, computing an effective mass that accounts for at least a subset of bodies of the plurality of subsystems and for at least a portion of a topology and of an interconnectivity structure between the bodies of the plurality of subsystems; solving the dynamic equations of each interface of the set of interfaces, and computing at least one interface impulse for each interface using the effective mass; and solving dynamic equations of each of the plurality of subsystems to obtain a plurality of internal impulses.

Additional and/or alternative features, aspects and advantages of implementations of the present technology will become apparent from the following description, the accompanying drawings and the appended claims.

BRIEF DESCRIPTION OF THE DRAWINGS

For a better understanding of the embodiments described herein, and to show more clearly how they may be carried into effect, reference will now be made, by way of example, to the accompanying drawings in which.

Figure 1:
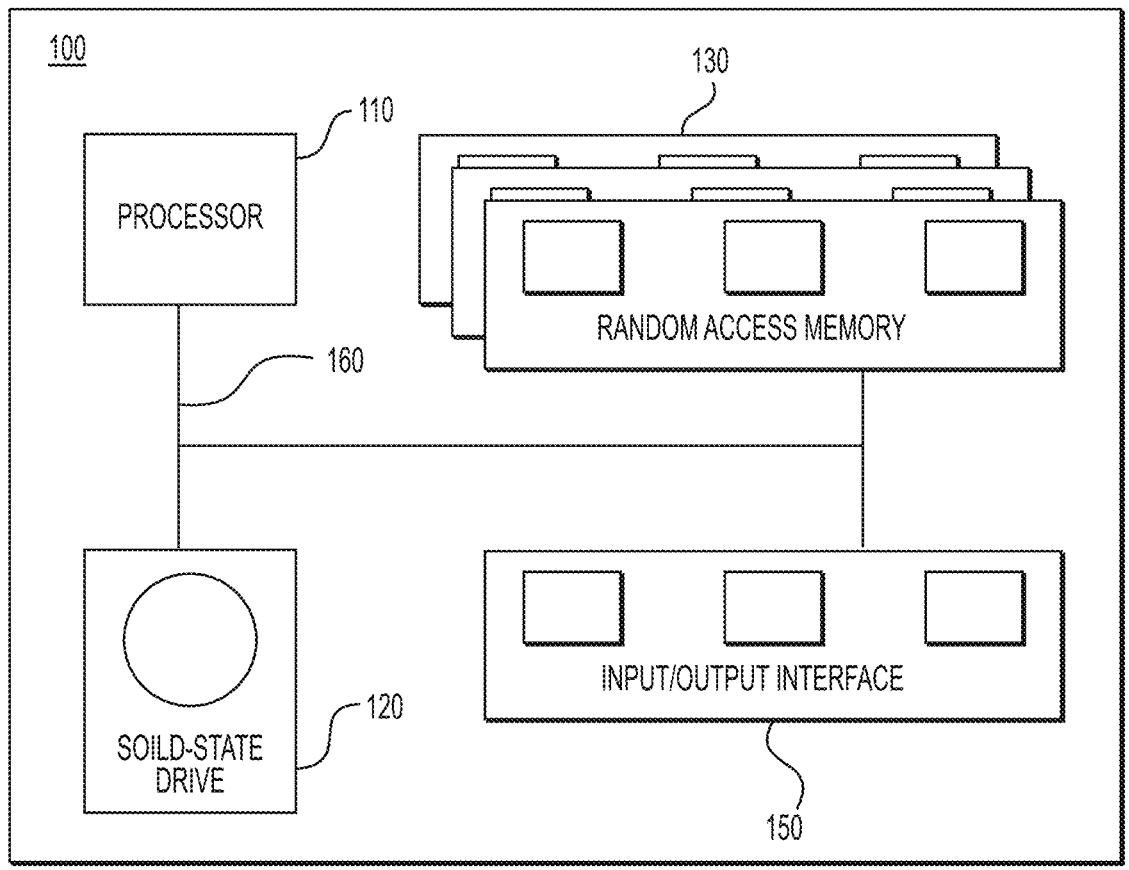
FIG. 1 is a block diagram of an example computing system in accordance with at least one embodiment of the systems described herein.

It should be noted that, unless otherwise explicitly specified herein, the drawings are not to scale.

DETAILED DESCRIPTION

The Schur complement domain decomposition method permits the solution of large, sparse linear systems through a number of smaller system solves. While early uses of the method were important for systems that did not fit in memory, now that multi-core processors are prevalent in consumer hardware, the method has become more interesting for fast parallel computation. Because Schur complement domain decomposition can work with direct solvers, it can deal with stiff systems more gracefully than iterative methods. In contrast, slow convergence can be a common problem with iterative methods when dealing with the stiffness that frequently arises in physics based simulations. Specifically, the term stiff is used to describe poor conditioning, which can easily arise from a number of situations. In the case of multibody systems, examples include large mass ratios, redundant constraints from contacts or loops, and the small compliances often used to regularize constraints. While iterative algorithms have been very popular in computer graphics compared to many other fields, and while preconditioning can help in dealing with stiff systems, there is nevertheless a number of examples where previous work has recognized the benefits and applied direct solvers, such as in the solution of stiff rods (e.g. Deul et al., 2018), and for adaptive discretization in cloth simulation (Narain et al., 2012).

At least some of the embodiments described herein address the use of direct solvers for interactive simulation of stiff multibody systems with contact. As previously noted, typical systems include both bilateral and unilateral constraints, as well as friction at the contact interfaces. Bilateral constraints typically model joints, articulations and actuators, while unilateral constraints are necessary to represent direct contact interactions between rigid bodies. Bilateral constraints can also have bounds that introduce further inequalities into the formulation. One common modeling approach for these problems leads to a dynamics formulation where the core mathematical model can be derived in the form of a mixed linear complementarity problem (MLCP). Numerous rigid body dynamics platforms employ MLCP formulations to model physical problems. Unfortunately, the solution of an MLCP is more involved than solving a linear system and does not permit a direct application of Schur complement domain decomposition to speed up computation.

In a broad aspect, Applicants have developed and applied embodiments of methods, involving substructuring, to speed up the solution of the MLCP representing the rigid body dynamics problem. Accordingly, applications of the methods result in a marked improvement in the performance of, particularly, computing systems on which physics-based, multibody simulations are executed. The main idea behind substructuring is to split the overall physical system being modeled into smaller subsystems to solve them separately, and interface them using reduced-order models of the individual subsystems that rely on the concept of effective mass. Methods taught by Applicants and described herein are based on the Schur complement domain decomposition approach, with adjustments to identify and correctly handle unilateral constraints. The effective mass representation includes the effect of both bilateral and unilateral constraints within a subsystem. In one improved aspect, applications of the methods described herein can facilitate efficient parallel computation of the full system, without the convergence issues of iterative methods.

In a broad aspect, embodiments of the methods described herein may be implemented in simulations for interactive and real-time applications. Interactive simulation is particularly important for, as examples, training simulators, virtual reality, and video games, which are application areas that can benefit from methods capable of providing improved performance (e.g., in terms of computational speed) without sacrificing solution accuracy.

Modeling Multibody Systems—General Considerations

Modeling contact dynamics in physical multi-rigid-body systems can generally lead to complementarity problems. In such systems, the rigid bodies can be connected to each other through joints represented by bilateral constraints and direct contacts given by unilateral, non-penetration constraints, which generally lead to an MLCP model. Such a model can also be formulated as a convex, quadratic optimization problem. The consideration of Coulomb friction at the contacts complicates the mathematical formulation and turns it into a nonlinear complementarity problem. This is particularly due to the physical nature of friction that, for a contact pair, the friction force depends on the normal constraint force, and it is limited by the friction cone constraint. However, with a proper approximation of the friction cone, the core algorithmic problem can be led back to an MLCP. The solution of such MLCP contact formulations has significant applications in, for example: computer graphics, various engineering fields, animation, and interactive simulation of virtual environments.

While fast linear time dynamics is possible for multibody systems with tree-structured constraints, parallel computing can offer possibilities to further accelerate the solution of MLCP formulations in multi-core central processing unit (CPU) environments. For this, the multibody system has to be partitioned into subsystems that interface each other. This problem has received significant attention for various problems where the rigid bodies mainly interact through articulations represented by bilateral constraints with no bounds. For such cases, the problem is a system of linear equations rather than the more difficult general MLCP problem. A divide-and-conquer approach was proposed for such systems by Featherstone. In this line of approach the subsystems are termed articulated bodies and the interfaces are called handles. That approach essentially imposes a sequential application of constraints and makes parallel implementation on multi-core CPUs possible. Several enhanced variants of the approach have also been reported, which target both CPU and graphics processing unit (GPU) implementations. However, that approach and its variants may suffer from the following disadvantages: the explicit availability of inverse mass matrices is required, it only works for bilateral joints with no bounds, and even for such cases it cannot handle Coulomb friction.

The Schur complement (SC) is a common tool in the decomposition of systems. It is a method that requires only that variables of the system be separable into non-overlapping sub-domains, where variables belonging to a particular sub-domain are contiguous but variables belonging to two different sub-domains are connected only by a set of interface variables. Each sub-domain may then be processed independently and in a parallel fashion, thus exploiting modern multi-core processor hardware and cloud computing platforms. Using the SC method for simulations that involve only unbounded variables has previously been proposed for simulating vehicle dynamics and fluid dynamics. In the case of vehicles, the dynamical system can be decomposed into a main subsystem (e.g., chassis) with several other subsystems that branch out from the main subsystem (e.g., suspension, drivetrain) based on the special topology of vehicles. In the case of fluids, the SC is commonly used to solve the pressure Poisson equations by a regular decomposition of the fluid grid. In both instances, the problem domain contains unbounded variables (e.g., bilateral constraints used to model vehicle joints).

However, a novel aspect of the embodiments described herein is that it extends the SC method to include simulations involving unilateral ("one-sided") variables, which correctly accounts for physical phenomena such as contact detachment and sliding friction. In particular, such simulations may include, but are not limited to, simulations with contact modeled as a linear complementarity problem (LCP).

Earlier work addressed the problem of partitioned dynamics by interleaved simulations. In accordance with one known methodology in the name of Lacoursière, multibody systems are partitioned at points where they are weakly coupled, and the interface is resolved with block projected Gauss-Seidel iterations. The method needs warm-starting to achieve faster convergence. For N subsystems, it solves N+1 MLCPs in every iteration, but the system matrices are taken directly as blocks of the main problem's matrix. Although the constraint forces can be solved by a direct method, that formulation only takes into account the dynamics of the bodies directly connected at the interface, thus ignoring the internal dynamics of each subsystem while solving for the interface constraints. Because the subsystems are only weakly coupled, interface forces are resolved in an iterative manner, and many iterations are required for stiff problems. Otherwise, the interface constraints appear soft with large constraint violations. This approach may be referred to as force based interface coupling (FBIC).

An important difference compared to FBIC, is that in respect of at least some embodiments described in the present specification the inverse effective mass is formed via the Schur complement based on an index set (subset of indices labeling the active constraints) of the subsystems' constraints, which accounts for contact detachment and sliding. Methods described herein account for coupling of the entire subsystem, and use this to compute the effective inverse mass and force/impulse terms. While only a few coupling iterations may be needed to identify the active constraints (e.g., detaching and sliding of contacts), a solution can likewise be obtained in one iteration if the set of active constraints does not change from the previous time step. The effective mass may be computed using a modified Schur complement that only considers the active constraints in each subsystem. Iteration over the values of constraint forces is not performed; rather iteration over the index set of the constraints may be performed, following a pivoting-like approach. Other methods for computing the effective mass exist and may be used in other embodiments; for example, recursive methods that use the topology of the subsystems may be employed.

The effective mass of a subsystem at an interface is governed by the mass properties of the bodies of the subsystem, the active constraints in the subsystem, and the type of motion, i.e., a combination of translations and rotations, represented by the interface. In accordance with embodiments of the methods described herein, the effective mass computation of a subsystem takes into account all bodies of that subsystem, not only the bodies that are directly at the interface. The complete topology and inter-connectivity structure between the bodies are also taken into account. The structure is governed by the active constraints. The methods can address the general case involving bilateral constraints with no bounds, as well as cases having bilateral constraints with bounds, unilateral constraints, and any combination of these as may be present in the subsystem to represent the interaction among the bodies of the subsystem. If the subsystem were to have only bilateral constraints, i.e., equality constraints, with no bounds, then all constraints would be active at all times, the expression of the effective mass would simplify, and its computation would be straight-forward. However, this particular scenario represents only a small subset of systems that can be modeled by embodiments of the methods described herein.

Domain decomposition in elastic problems can exploit local model reduction, providing opportunities for fast solutions in addition to parallel computing. One known disclosure in the name of Parker and O'Brien describes partitioning and parallelism in elastic systems with contact, where the system is divided into domains to parallelize the solve (a common technique in modern multibody physics engines), and also parallelizing matrix multiplication operations for solving very large systems. For massive parallelization on GPU, blocked Gauss-Seidel approaches have been preferred, using a graph coloring algorithm to make partitions. Relatedly, there is known a staggered projection approach, which places contact normal and tangential forces into separate blocks. However, solvers for elastic systems can struggle to handle stiff multibody systems with LCP contact constraints. Approximate solutions to stiff constraint problems may need an additional solve (i.e., solving a linear system of equations for a set of unknown variables) to stabilize the constraints. While stabilization is generally unavoidable, stiff problems and those with large mass ratios are scenarios where it is still desirable to use methods that can produce accurate solutions.

Various techniques can be used to speed up convergence and improve solutions to multibody simulation problems. Warm starting and shock propagation may help projected Gauss-Seidel and impulse based methods. Long range constraints can likewise be very beneficial in special cases, such as chains. In contrast, embodiments described herein do not require any modifications to the model or make assumptions that would otherwise limit applicability.

In the context of off-line simulations, other methods such as accelerated projected gradient descent exist, with applications in the simulation of granular materials. A domain decomposition algorithm in the name of Visseq et al. was also proposed for granular materials, based on the so-called gluing approach. Contact is present within the domains, which are made of grains, and the grains between domains define the interface. However, the interface problem consists of the gluing constraints, which are essentially equality constraints that only take into account the dynamics of the pairs of glued grains, and it does not consider the internal dynamics of the domains.

It is further noted that domain decomposition and sub-structuring may bear relation to certain graph partition algorithms such as METIS and SCOTCH, which produce reduced fill-in orderings for sparse matrices. However, these algorithms are generally not well-suited for certain real-time and interactive applications.

In respect of at least one embodiment described herein, there is proposed an automatic partitioning method that works well for scenarios where the constraint graph is not known ahead of time, and requires very little computational overhead.

Described herein, with reference to a number of example embodiments, are novel and non-obvious systems and methods for solving large multibody systems that include both bilateral and unilateral constraints, based on a substructuring technique. Substructuring permits parallelization of physics simulation on multi-core CPUs. At least some embodiments described herein are based on a non-overlapping domain-decomposition Schur complement method, extended to physical multibody systems involving contact formulated as mixed bounds linear complementary problems. At each time step of a given simulation, the subsystem and interface constraint impulses are alternately solved, leading to the identification of the active constraints. By using the correct active constraints in the computation of the effective mass of subsystems within the interface solve, an exact solution can be directly obtained. Resulting simulations have preferable behaviour in comparison to standard iterative methods and force based subsystem coupling. In certain embodiments, methods described herein may also work well with user-selected semantic partitioning, as well as with a minimum degree partitioning method. Moreover, when making use of direct solvers, interactive and real-time frame rates may be achieved for a number of challenging scenarios, particularly those involving large mass ratios, redundant constraints, and ill-conditioned systems.

It should be noted that although MLCP has been identified as one example formulation in this introductory discussion, this is for ease of exposition; skilled persons will note that the methods to be described herein will apply to substructuring involving other complementarity problems.

Computer-Based Simulation Systems

In one aspect, various implementations of embodiments described herein provide a method for executing a simulation of a multibody system, wherein the method comprises simulating the multibody system using a computerized physics-based simulator. In another aspect, various implementations of embodiments described herein provide a computing system for executing a simulation of a multibody system, wherein the computing system comprises at least one processor and a non-transitory computer-readable medium, the non-transitory computer-readable medium comprising control logic which, upon execution by the at least one processor, causes operation of a physics-based simulator for simulating the multibody system.

As it may be appreciated, a physics-based simulator may compute motions of rigid bodies based on dynamic equations, typically subject to gravity and possibly connected using kinematic constraints also referred to as joints, such as, but not limited to, a hinge or slider constraint. Examples of physics-based simulators may include, but are not limited to: Bullet, Open Dynamics Engine (ODE), Havok, Simmechanics™ from Matlab and Vortex™ from CM Labs.

In another aspect, various implementations of embodiments described herein provide a non-transitory computer-readable medium storing program instructions for executing a simulation of a multibody system, the program instructions being executable by at least one processor of a computing system to carry out one or more of the methods described herein.

In another aspect, various implementations of embodiments described herein provide a computing system, such as, for example, but without being limitative, an electronic device comprising at least one processor and a memory storing program instructions for executing a simulation of a multibody system, the program instructions being executable by the at least one processor of the electronic device to carry out one or more of the methods described herein.

In the context of the present specification, unless expressly provided otherwise, a computing system may refer, but is not limited to, a computer, a computerized system, a computing device, an electronic device, a computer-based simulator, a simulator, a simulation system, and/or any combination or variant thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. Whenever appropriate, "a" computer-readable medium and "the" computer-readable medium may be construed as referring to the same computer-readable medium or to different computer-readable media.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the present description may describe relatively simplified implementations of the embodiments described herein. As persons skilled in the art would understand, variant implementations may be of greater complexity.

In some cases, examples of modifications to embodiments described herein may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of described embodiments, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, pseudo-code, and the like represent various processes which may be substantially represented in computer-readable media and so executed by a computing device or processor, whether or not such computing device or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general purpose processor, such as a central processing unit (CPU), a graphics processing unit (GPU), a tensor processing unit (TPU), or a processor dedicated to a specific purpose, such as a digital signal processor (DSP). Moreover, explicit use of the term a "processor", a "simulation application", and the like should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process acts and/or textual description. Such modules may be executed by hardware that is expressly or implicitly shown. Moreover, it should be understood that modules may include for example, but without being limitative, computer program logic, computer program instructions, software, stack, firmware, hardware circuitry, or a combination thereof, which provides the required capabilities.

An example computing system will be described with reference to FIG. 1. What follows is a consideration of some non-limiting example applications to illustrate various implementations of aspects of embodiments described herein.

FIG. 1 illustrates a diagram of a computing system 100 in accordance with at least one embodiment is shown. In some embodiments, the computing system 100 may be implemented by any of a conventional personal computer, a computer dedicated to operating simulations and/or an electronic device (such as, but not limited to, a mobile device, a video game system, a tablet device, a server, etc.) and/or any combination thereof appropriate to the relevant task at hand. In some embodiments, the computing system 100 comprises various hardware components including one or more single or multi-core processors collectively represented by a processor 110, a solid-state drive 120, a random access memory 130 and an input/output interface 150. The computing system 100 may be a computing device that is specifically designed for operating simulation engines and/or physics engines. In some alternative embodiments, the computing system 100 may be a generic computing system.

In some embodiments, the computing system 100 may also be a subsystem of one of the previously identified systems. In some other embodiments, the computing system 100 may be an "off the shelf" generic computing system. In some embodiments, the computing system 100 may also be distributed amongst multiple systems. The computing system 100 may also be specifically dedicated to the implementation of one or more embodiments described herein. As a person skilled in the art may appreciate, multiple variations as to how the computing system 100 is implemented may be envisioned without departing from the scope of the present technology.

Communication between the various components of the computing system 100 may be enabled by one or more internal and/or external buses 160 (e.g., a PCI bus, universal serial bus, IEEE 1394 "Firewire" bus, SCSI bus, Serial-ATA bus, ARINC bus, etc.), to which the various hardware components are electronically coupled.

The input/output interface 150 may allow enabling networking capabilities such as wired or wireless access. As an example, the input/output interface 150 may comprise a networking interface such as, but not limited to, a network port, a network socket, a network interface controller and the like. Multiple examples of how the networking interface may be implemented will be apparent to persons skilled in the art. For example, but without being limitative, the networking interface may implement specific physical layer and data link layer standard such as Ethernet, Fibre Channel, Wi-Fi or Token Ring. The specific physical layer and the data link layer may provide a base for a full network protocol stack, allowing communication among small groups of computers on the same local area network (LAN) and large-scale network communications through routable protocols, such as Internet Protocol (IP).

According to implementations of the present technology, the solid-state drive 120 stores program instructions suitable for being loaded into the random access memory 130 and executed by the processor 110 for executing a simulation of a multibody system. For example, the program instructions may be part of a library or an application.

In at least one embodiment, there is provided a simulator configured to perform simulations, which can be used to build virtual reality (VR) environments (e.g., for training, human factors engineering, etc.). A simulator may comprise multiple computing devices (e.g., computing system 100); for example, one computing device may execute a multibody simulation, while other computing devices may execute graphics rendering tasks. The simulator may also comprise an instructor console, where an instructor can initiate simulations for different scenarios, monitor simulation progress, alter simulation parameters (e.g., wind, time of day), initiate the simulation of malfunctions, etc.

Multiple computing devices may be communicatively coupled (e.g., a computing device executing the simulation may send kinematics data, such as the positions and orientation of objects, to other computing devices). Peripheral devices (not shown explicitly in FIG. 1), such as motion platform(s), joystick(s), etc. may be connected to any of the computing devices (e.g., directly or by network communication).

Computing system components may also be provided by or communicatively coupled to a machine in operation. For example, a programmable logic controller or PLC (e.g., a control computer) from an actual machine being simulated (e.g., crane, vehicle, etc.), or an actual operator console (e.g., with the same joysticks, pedals, and other devices from a real machine), can be coupled to a computing device configured to execute a simulation. In some implementations, certain connected devices may operate as if they are being used in the running of an actual machine, but in reality they may be receiving input from, and sending data to the computing device executing the simulation.

A computer-based simulator typically will also comprise a display (not explicitly shown in FIG. 1), which may comprise one or multiple display devices. In a simulation, the simulator is configured to output a sequence of images (e.g., frames) for display, where the sequence of images reflect the simulated positions and orientations of objects of the multibody system being simulated, over multiple time steps representing the duration of the simulation. In certain implementations, a head-tracking device may be coupled to the simulator to locate an operator's eyes with respect to a display; displayed images may be altered to give the operator the impression of sitting behind a window and to provide improved depth perception. In certain implementations, a motion-platform can be coupled to the simulator, and caused to move according to the motion of a simulated machine, in order to give the operator an improved immersive feel.

In at least one example implementation, a computer-based simulator may comprise a simulation and/or visualization platform that provides "true-to-life" simulations of, for example, equipment and environments. The simulator may comprise a mechanical dynamics engine that uses a physics-based approach to simulation. Virtual equipment performance may be modeled using engineering specifications, to provide realistic emergent behaviours unachievable using scripted performance. For example, in vehicle simulations, the simulator may model individual powertrain components, including engine, transmission, differential, brakes, and other components, to simulate vehicle performance. As a further example, the simulator may execute simulations of the operation of earth-cutting tools, and enable the simulation of earthmoving equipment, such as dozers, graders and excavators. As a further example, the simulator may execute simulations of the behavior of cables, tethers, winches, and/or pulleys, attached to equipment (e.g., for crane simulations, vehicle recovery simulations, towing scenarios, etc.). As a further example, the simulation may execute simulations of the operation of offshore equipment and environments. These examples of computer-based simulators are provided for illustrative purposes only and shall not limit the scope of the present technology. Embodiments described herein are generally directed to an improvement to these and other computer-based simulators, to provide improved performance (e.g., in terms of computational speed, for instance to maintain realism, real-time rendering, and/or interactivity) without sacrificing solution accuracy.

With respect to the types of multibody systems simulated by computer-based simulators, and to which at least some embodiments described herein may be directed, reference is now made to FIGS. 2A to 2D, which illustrate some examples of challenging stiff systems. In at least one example implementation, Applicants efficiently simulated these systems based on the teachings described herein. As compared to conventional formulations and solvers, such as those used in industry, Applicants achieved up to 20 times speed-up while producing a solution of equivalent accuracy to the full direct solve.

Figure 2A:
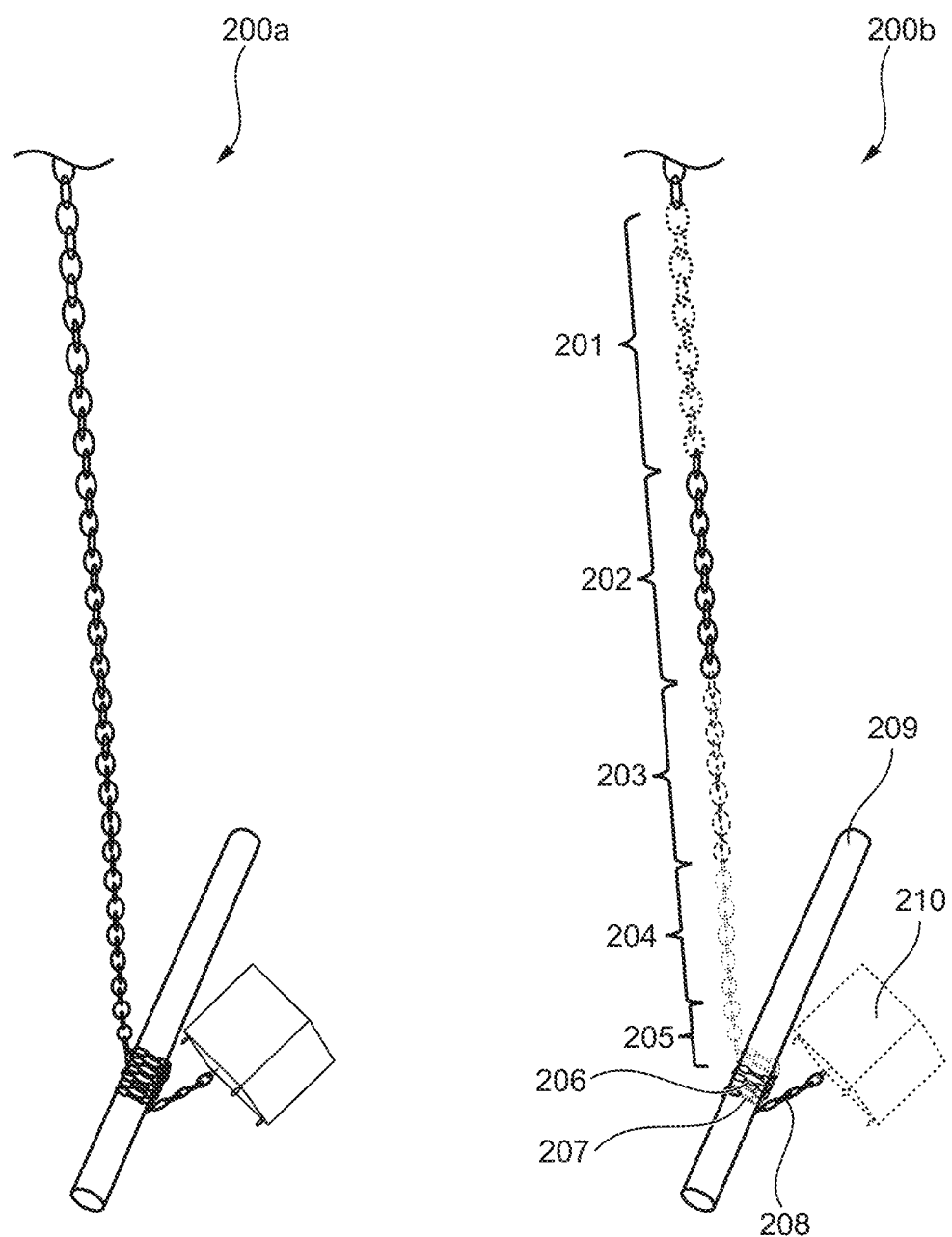
FIGS. 2A to 2D illustrate a number of examples of stiff systems.
Figure 2B:
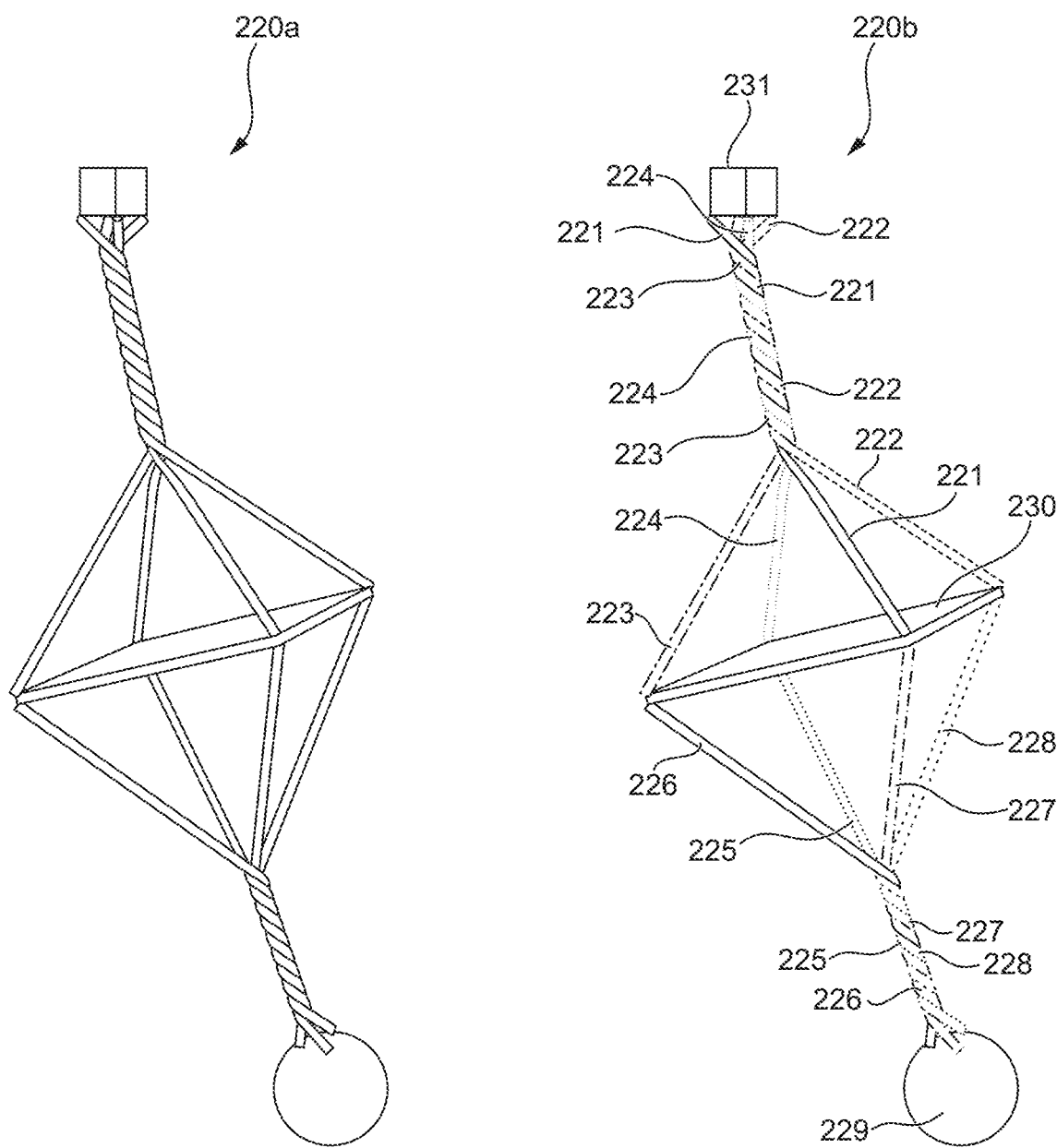
Figure 2C:
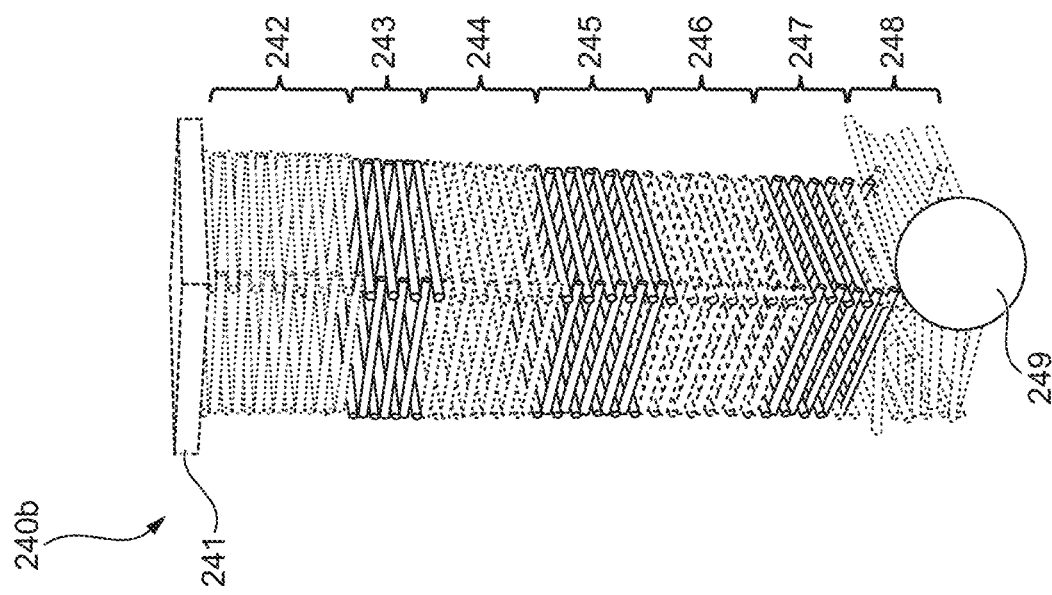
Figure 2C:
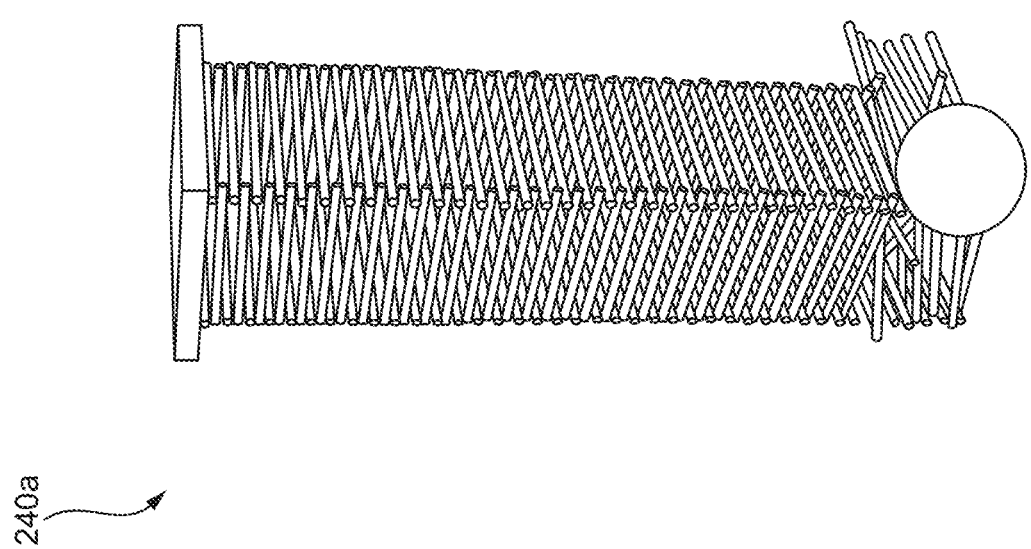
Figure 2D:
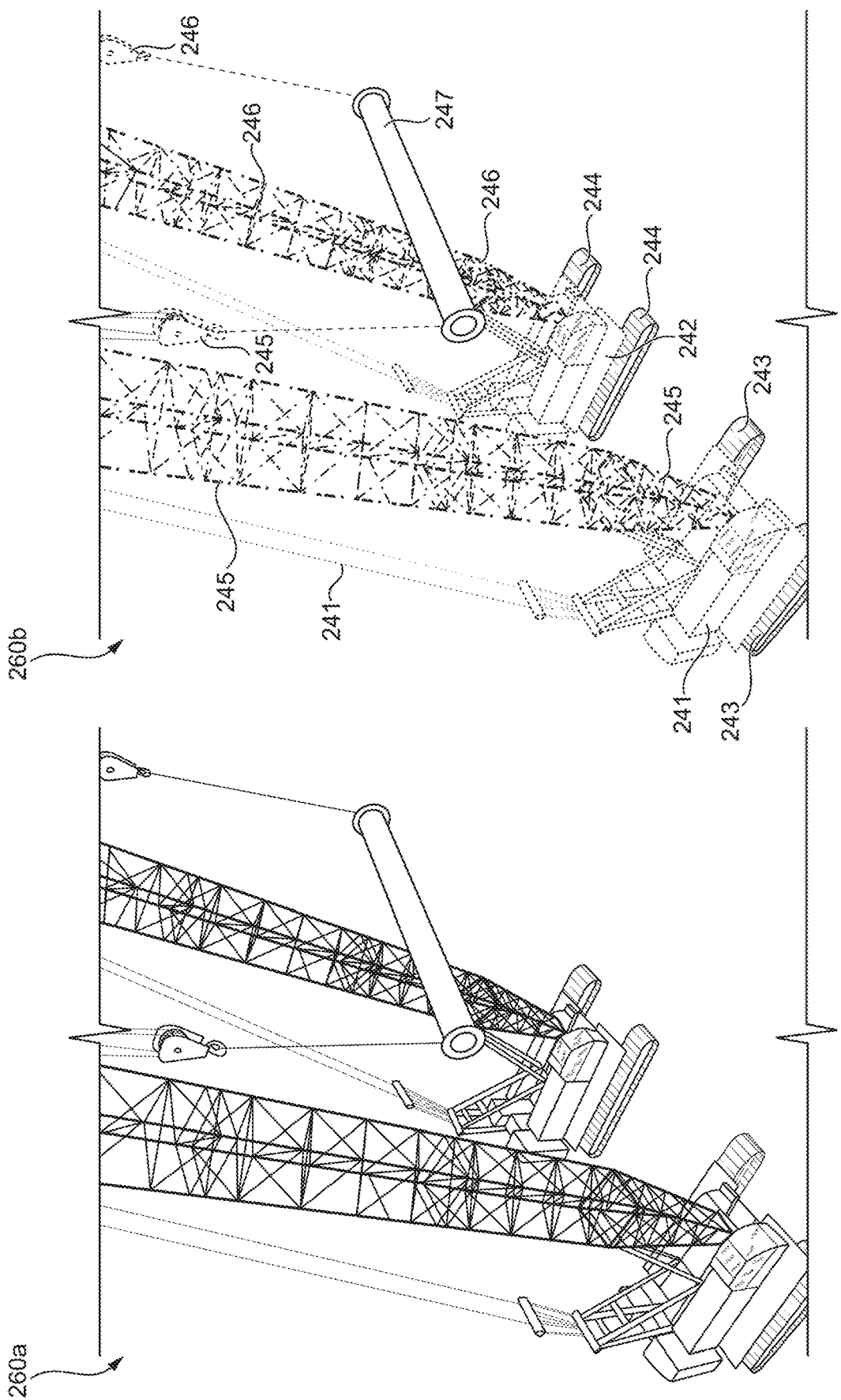

More specifically, the challenging scenarios depicted include: in FIG. 2A, a stiff chain with attached mass (chain wrap) shown generally as 200a, 200b; in FIG. 2B, an intertwined system of cables (cable spinner) shown generally as 220a, 220b; in FIG. 2C, a large stack of logs with heavy plate atop (log tower) shown generally as 240a, 240b; and in FIG. 2D, a dual crane training simulation (tandem cranes) shown generally as 260a, 260b. Each example was modeled as a multibody system with hundreds or thousands of constraints, stiff contacts, and mass ratios up to 40,000:1. The corresponding decomposition of the simulation is depicted in the second illustration of each of FIGS. 2A to 2D, where different reference numerals (e.g. 201, 202 . . . ; 221, 222 . . . ; etc.) identify bodies of different subsystems, and with lines between neighboring subsystems drawn in different weights for illustrative purposes. In the examples illustrated, subsystems are coupled by a Schur complement interface solver for efficient simulation.

Further Applications

Figure 9A:
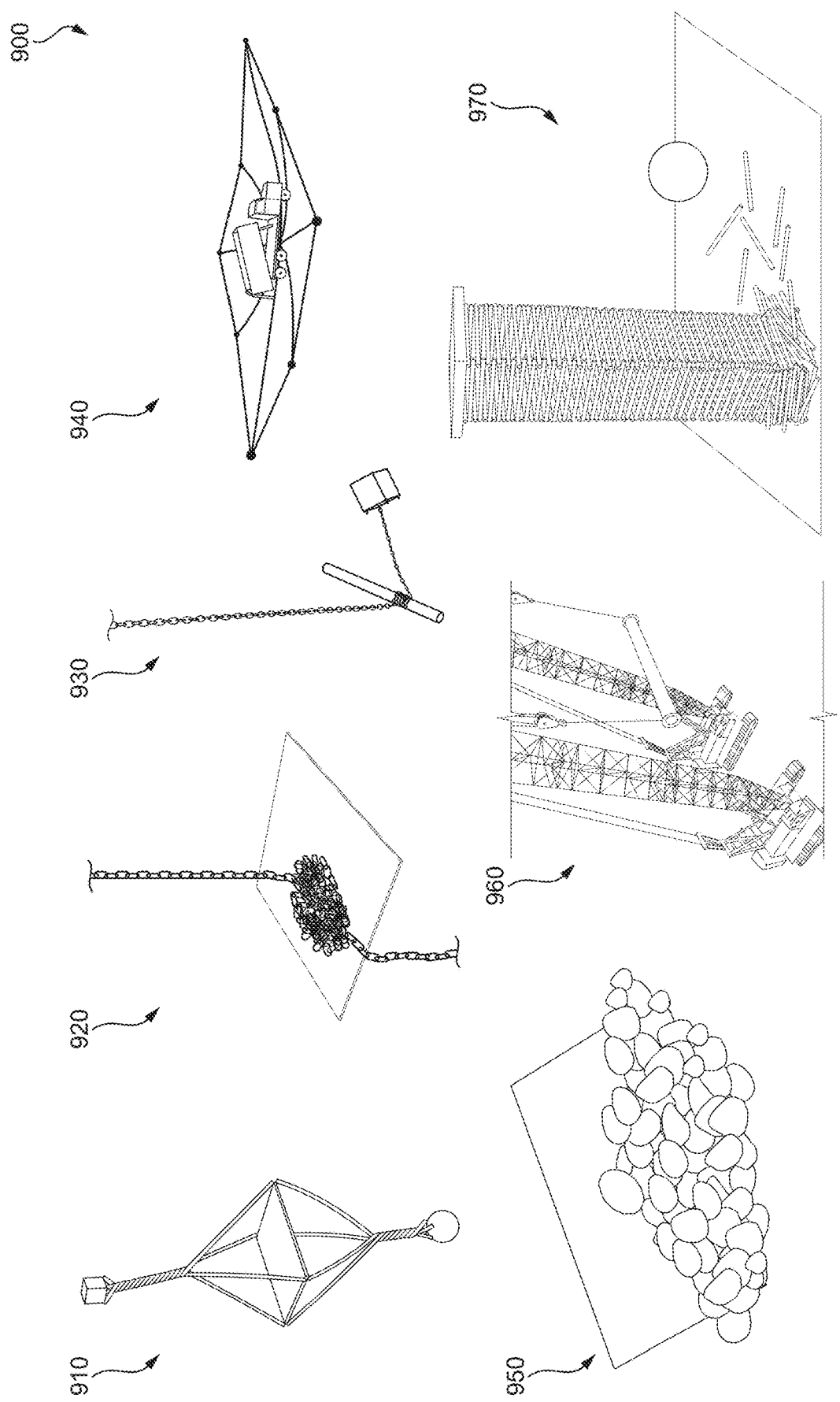
FIGS. 9A and 9B illustrates example screen captures generated from simulations, in respect of an example implementation.
Figure 9B:
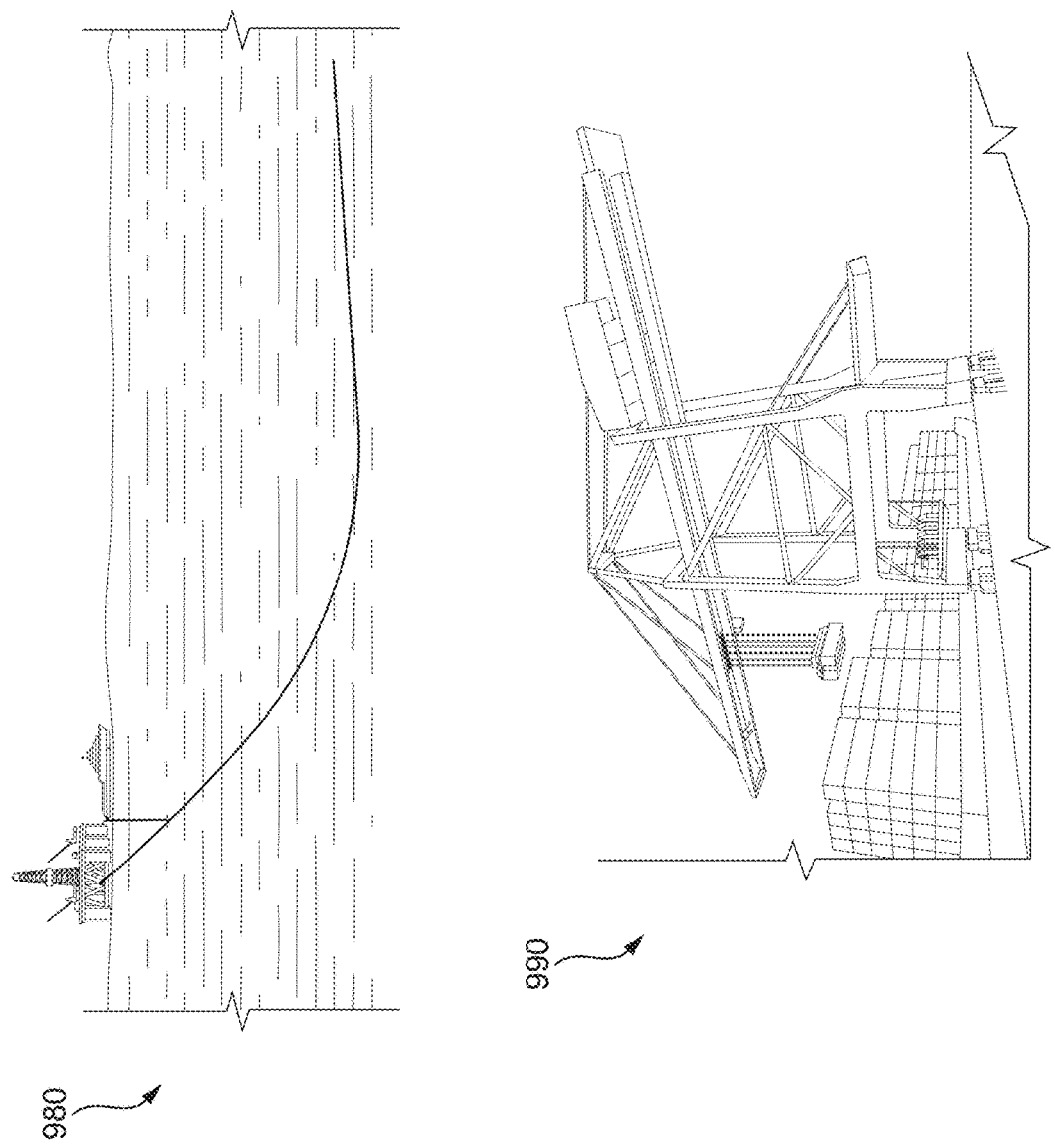

By way of further examples described below, other applications of the systems and methods for computer-based simulation described herein are identified below (see also FIGS. 9A and 9B and the corresponding description for additional examples).

Operator Training:

For (e.g., machine) operator training simulators, realistic and real-time simulations can be important to avoid negative training, and to impart proper reflexes, for example. It may be desirable for increasingly complex systems to be modeled, with higher fidelity. Some examples of applications where it has been difficult or impossible to simulate in real-time using conventional methods, with the stiffness and mass ratios required for accurate simulation, may include: multiple cranes lifting the same load(s); handling of large anchors that need to be lifted using a second ship; simulations involving long cables, optionally with complex machines (e.g., ships, cranes, etc.) attached to one or more ends; multiple vehicles interacting together, such as in a multi-vehicle accident (e.g., train), etc. Embodiments of the substructuring method described herein allows for an increase in the limit of complexity of systems that can be simulated, and enhances scalability in that use of additional processing cores can be facilitated for more complex simulations.

Engineering Design:

Fast simulations are useful for performing engineering design iterations. The performance of a specific design can be tested efficiently using fast simulation. For "human-in-the-loop" applications, usability and operator efficiency can be measured using real-time simulators. As a further example, with respect to systems to be tested in the loop (e.g., when connected to a programmable logic controller), these often call for fast simulations to be performed at small time steps.

Human Factors Engineering:

Simulations may also be performed in the area of usability testing, to provide feedback on engineering designs, or as a sales tool for machines (e.g., cranes) that have yet to be built.

Entertainment:

Fast simulations can be useful for animation purposes in movie-making; less time may be spent rendering movie frames if the simulation is fast. Applications in the field of interactive entertainment (e.g., games) are also facilitated.

Constrained Multibody Systems

Consider multibody system models composed of rigid bodies that interact with each other through constraints, which can restrict the motion of the system bilaterally or unilaterally. Direct contact between the bodies is commonly represented by such unilateral constraints, so that the dynamics can be formulated as a complementarity problem. Below, a general formulation for systems with bilateral constraints is introduced, and then contact is added to formulate an MLCP.

The motion of the system for a certain configuration is defined by the velocity of the n bodies, which can be arranged in the array of 6n generalized velocities v. For each body, the velocity with respect to the absolute frame of reference can be represented by three components of the velocity of its center of mass, and three components of the angular velocity. The interactions of the bodies with the environment and the interactions among the bodies are described through constraints. The m constraint velocities representing these modes of motion can be written as a linear combination of the generalized velocities, $$JV = w_0 \quad (1)$$

where J is the m×6n constraint Jacobian matrix, and $w_0$ contains the m constraint velocities. These components usually represent point velocities or angular velocities, which may be time derivatives of certain constraint functions at the position level. For example, joints can constrain the relative position and orientation between bodies.

The dynamic equations that govern the motion of the system relate the time derivatives of the generalized velocities to the forces acting on the system. By introducing a finite-difference approximation, the change in the generalized momentum from one step to the next can be related to the generalized impulse as:

$$M(v^+ - v) = hf + J^T \lambda^+ \quad (2)$$

where v and $v^+$ are the velocity at the beginning and at the end of the time step, respectively, and h is the time step size. M is the 6n×6n symmetric positive-definite mass matrix, which has a block-diagonal structure with a bandwidth of 3 due to the inertia matrices associated with the angular velocity components; and f is the n-dimensional generalized applied forces containing the Coriolis and centrifugal terms and other forces, such as gravity. The m unknown constraint impulses are arranged in $\lambda^+$ and can be related to the constraint forces and moments through the time step size. In the following description, the terms impulses and forces are used to indicate generalized impulses and generalized forces (e.g., also including torques).

The constraints in Eq. (1) can become dependent on each other (i.e., the Jacobian Matrix J is rank deficient), leading to a constraint redundancy problem. In such a case, the impulses $\lambda^+$ cannot be uniquely determined. To cope with this, it is possible to relax the constraints and regularize the force using a constitutive relation such as:

$$Jv^+ + C\lambda^+ + h^{-1}\phi = w_0 \quad (3)$$

where C is the m×m symmetric positive-definitive matrix associated with the compliance of the regularized constraints, which is usually diagonal, and $\phi$ accounts for the constraint violation at the position level in the current time step.

By arranging the two earlier equations, the augmented form of the impulse-momentum level formulation can be written as:

$$\begin{bmatrix} M & -J^T \\ J & C \end{bmatrix} \begin{bmatrix} v^+ \\ \lambda^+ \end{bmatrix} = \begin{bmatrix} p \\ -d \end{bmatrix} \quad (4)$$

where $p = Mv + hf$ and $d = h^{-1}\phi - w_0$ to simplify the notation. It is possible to formulate a problem for the constraint impulses $\lambda^+$ by taking the Schur complement of the mass matrix M in Eq. (4):

$$(JM^{-1}J^T + C)\lambda^+ = -d - JM^{-1}p \quad (5)$$

where the inverse of the mass matrix $M^{-1}$ can be computed in closed form because of its block-diagonal structure. This formulation gives a linear system in which fewer variables need to be solved at each step, since typically m<6n. Furthermore, the velocities can be calculated at the end of the time step after having computed the constraint impulses.

It is worth noting that the matrix in Eq. (5) can become ill-conditioned for stiff systems, which have low compliance C. This occurs when the system has large mass ratios, or when the constraints are redundant, or a combination of both. In such a case, the condition number of the inverse effective mass $JM^{-1}J^T$ can be quite large.

The Mixed Linear Complementarity Problem

The impulses $\lambda^+$ can be limited to certain values depending on the kind of constraint, e.g., unilateral constraints have non-negative impulses. For a given time step, the following inequalities can be written:

$$l \leq \lambda^+ \leq u \qquad (6)$$

where l and u contain the lower and upper bounds for the constraint impulses, respectively, which can be set to +/−infinity to represent bilateral constraints. Then, the formulation in Eq. (5) can be written as an MLCP:

$$\underbrace{(JM^{-1}J^T + C)}_{A}\lambda^+ + \underbrace{d + JM^{-1}p}_{b} = w^+ \qquad (7)$$
$$l \leq \lambda^+ \leq u$$

where $w^+ = w_l^+ - w_u^+$ contain the slack velocities associated with the bounds of the constraint impulses. These are related to the constraint velocity, and need to satisfy the following complementarity conditions:

$$0 \leq u - \lambda^+ \perp w_u^+ \geq 0$$
$$0 \leq \lambda^+ - l \perp w_l^+ \geq 0 \qquad (8)$$

where $\perp$ denotes component-wise complementarity. Nevertheless, to simply the notation, only inequalities are used in Eq. (6) to denote an MLCP with bounded impulses $\lambda^+$ and slack velocities $w^+$.

Contact is often represented by unilateral constraints, in which the relative velocity of each contact point is decomposed in one normal and two tangential components, so that the constraint impulses in $\lambda^+$ represent the normal and friction force components. In order to allow contact detachment, the normal impulse needs to be non-negative, $$\lambda_n^+ \geq 0. \qquad (9)$$

On the other hand, Coulomb friction defines a constraint on the tangential velocity with a limit for the resultant friction force. The friction constraint can be enforced component-wise by defining upper and lower bounds for the two friction force components as:

$$-\mu\lambda_n \leq \lambda_{t_j}^+ \leq +\mu\lambda_n \qquad (10)$$

where j=1, 2 denote two directions in the tangent plane, and $\lambda_n$ is taken from the previous time step. This is also known as the box friction model, which replaces the original nonlinear inequalities of the Coulomb model by linear ones via a linear approximation of the friction cone, the so-called facetization of the friction cone.

Figure 3:
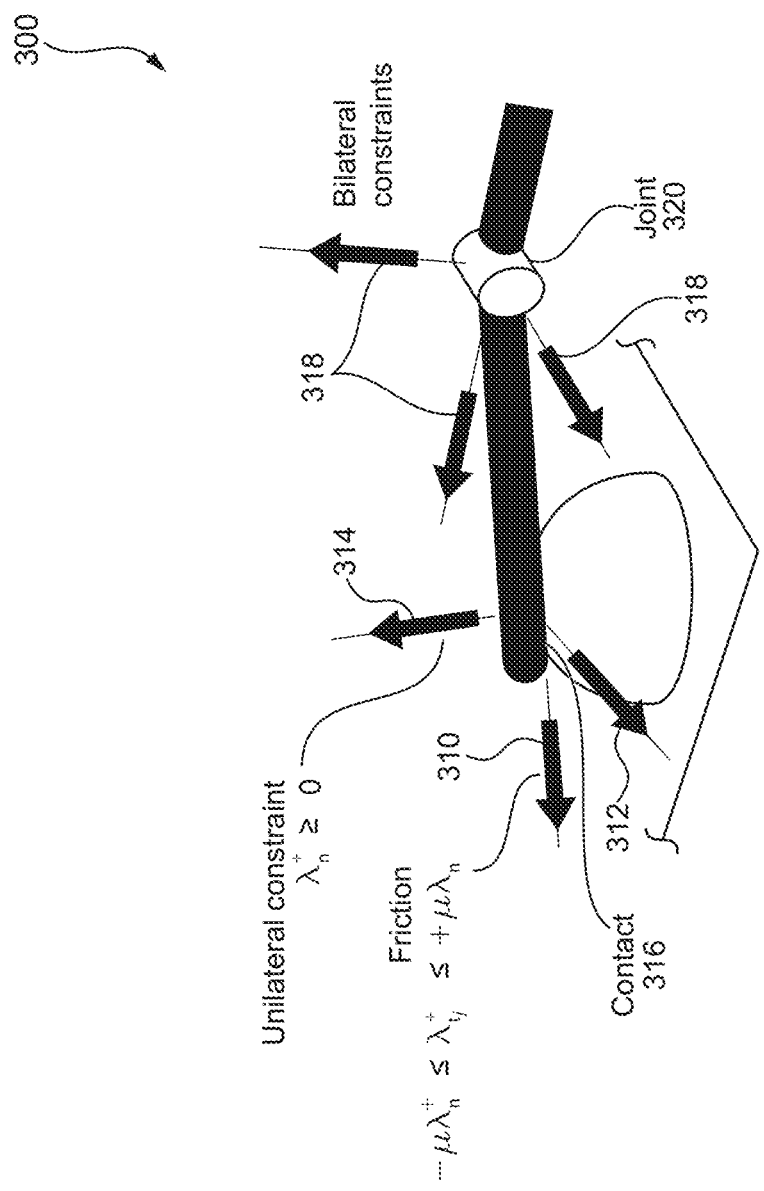
FIG. 3 illustrates different kinds of constraint forces in a multibody system with contact.

FIG. 3 illustrates the different kinds of constraint forces in a multibody system with contacts shown generally as 300. The constraint forces include the friction force components 310, 312 and the normal component 314 of contact point 316, and bilateral force components 318 constrained by joint 320.

For a contact point, the slack velocity $w^+$ is related to the normal velocity component, and it must be zero while the bodies are in contact. However, when the contact detaches, the impulse must be zero and the slack velocity becomes positive to satisfy the complementarity conditions. For the case of friction, when the impulse is within the bounds, the slack velocity must be zero, and so the contact is sticking. Otherwise, when it reaches a bound, the contact is sliding, and so the slack velocity is different from zero. In general, the complementarity conditions in Eq. (8) can also be defined as:

$$\begin{cases} w^+ \geq 0 & \text{if } \lambda^+ = 1, \\ w^+ = 0 & \text{if } \lambda^+ \in (l, u), \\ w^+ \leq 0 & \text{if } \lambda^+ = u \end{cases} \qquad (11)$$

where the impulses within bounds $\lambda^+ \in (l, u)$ are known as active, and the ones at the bounds $\lambda^+ = l$ or u are known as tight.

Substructuring of Multibody Systems

The central idea behind substructuring is to define non-overlapping subsystems of bodies that only interact through a set of coupling interface constraints (Γ). In such a case, the internal constraints (Ω) of each subsystem can be solved in parallel, which can lead to a significant reduction in computational time. The way in which the interface is solved can have a significant impact on both the efficiency and accuracy of the solver. Some approaches determine the interface forces iteratively, by alternating between the interface solve and internal subsystems solve. However, if due care is not taken when solving for the interface constraints iteratively, weak coupling between the subsystems means that ill-conditioned systems will converge slowly.

Embodiments described herein are directed, at least in part, to a substructuring solver that formulates the interface dynamics by taking the internal dynamics of the subsystems into account. The formulation of the interface constraints is based on the Schur complement, and uses the effective mass of the subsystems to emulate their internal behavior. With this method, it is not necessary to perform any iterations if all the constraints in the systems are bilateral. However, multiple iterations may be needed if there is contact in the subsystems or any constraint with bounds. This is because the effective mass depends on the internal topology of the subsystems, which changes based on the index set of the constraint variables (e.g., if a contact detaches).

Figure 4:
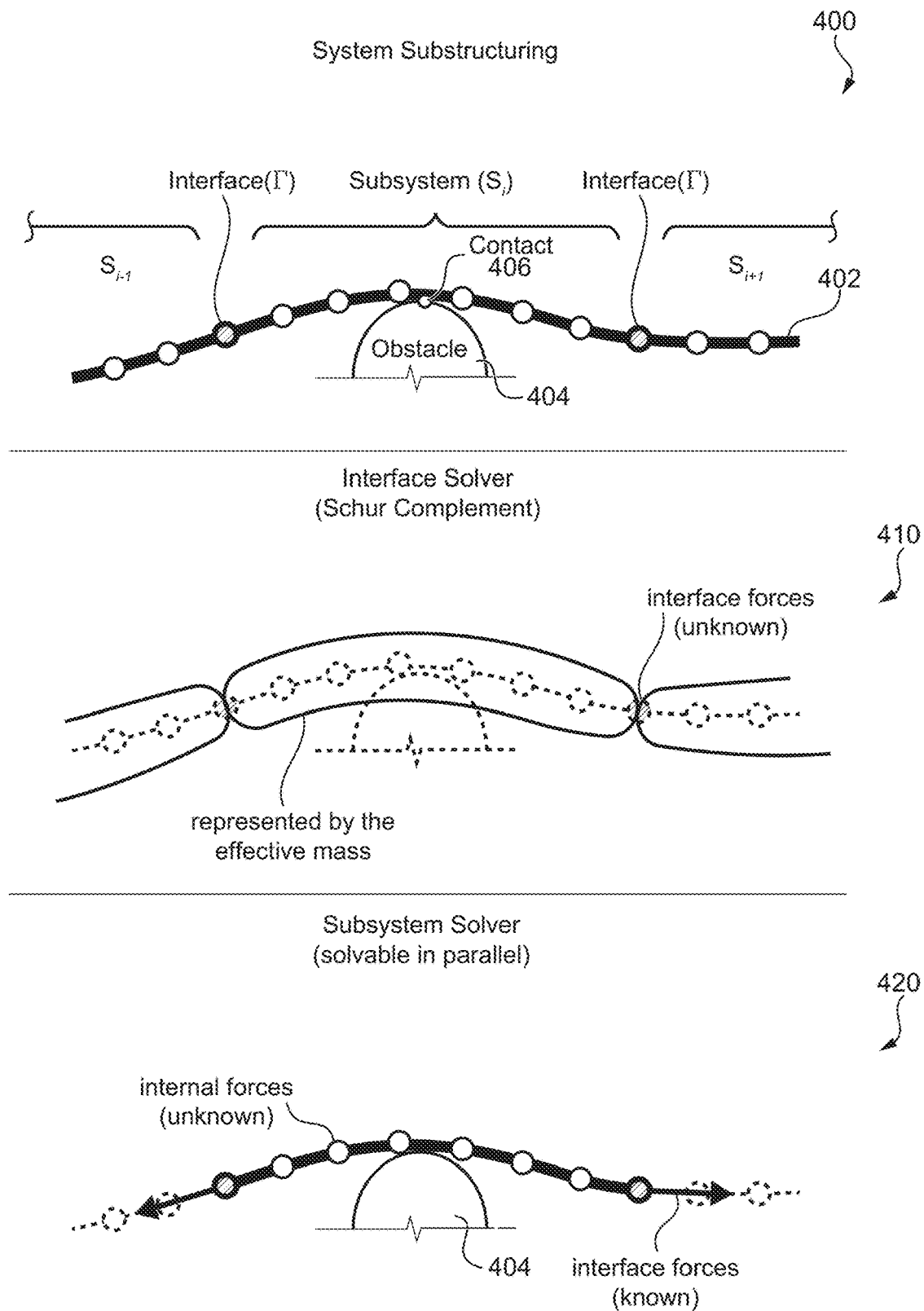
FIG. 4 illustrates an act of substructuring of a multibody system, by way of a chain example in contact with an obstacle.

FIG. 4 illustrates an application of this method for a chain example shown generally as 400. More particularly, FIG. 4 illustrates an act of substructuring a multibody system, illustrated with a chain 402 in contact with an obstacle 404. The two solves performed by the Schur complement method will be described in further detail in the sections to follow: interface solver (410) and subsystem solver (420).

Intuitively, if the chain 402 is pulled to the right or left, the mass of the links is transferred throughout the chain 402, and any load on one end would be perceived form the other end. Similarly, the effective mass of every subsystem ( . . . $S_{i-1}$, $S_i$, $S_{i+1}$ . . . ) is taken into account when solving for the interface constraints. For this example, if there were only bilateral constraints the effective mass can be uniquely determined, because all the bodies are linked together and the topology does not change. However, in the presence of unilateral constraints, or other constraints with limits, the effective mass needs to be computed only using the active constraints. For example, if the chain 402 is pulled down, it will contact the obstacle 404 at a point of contact 406, and the mass of the obstacle 404 will be perceived by the rest of the chain 402. On the other hand, if the chain 402 is pulled up and the contact 406 detaches, the chain 402 will not perceive the mass of the obstacle 404. Similar effects occur as the chain 402 is pulled over the surface of the obstacle 404 and friction forces transition from a static phase to a sliding phase.

Tight constraints (e.g., a contact that detaches) do not act as constraints anymore, but rather as applied impulses with a fixed value, the bound. Likewise, friction only acts as a constraint if the contact is not sliding. However, the state of the constraints (active or tight) is not known before solving the subsystems; thus, some iterations are typically needed in order to determine which are the active constraints in the subsystems.

The Schur Complement Method

The substructuring method for multibody systems using the Schur complement will now be introduced. First, consider a system partitioned into N subsystems with a block diagonal mass matrix:

$$M = \begin{bmatrix} M_1 & & \\ & \ddots & \\ & & M_N \end{bmatrix}, \quad (12)$$

where $M_i$ is the mass matrix associated with the i-th subsystem, and the constraint Jacobian matrix can be reordered to group the constraints as internal ($\Omega$) and interface ($\Gamma$) as follows:

$$J = \begin{bmatrix} J_\Omega \\ J_\Gamma \end{bmatrix} = \begin{bmatrix} J_1 & & \\ & \ddots & \\ & & J_N \\ \hline J_{\Gamma_1} & \cdots & J_{\Gamma_N} \end{bmatrix}. \quad (13)$$

Here, diagonal block $J_i$ contains only the constraints inside the i-th subsystem, while $J_{\Gamma_i}$ contains the interface constraints that couple the i-th subsystem with the others. The subsystems are only coupled through the interface constraints in $J_\Gamma$, and each interface constraint is split among the blocks $J_i$ of the subsystems it couples. Additionally, there are corresponding compliance matrices for all these constraints, denoted as $C_i$, $\forall$ i=1 . . . N, for the internal constraints, and $C_\Gamma$ for the interface constraints.

Therefore, the MLCP in Eq. (7) can be rewritten as:

$$\begin{bmatrix} A_1 & & & G_1^T \\ & \ddots & & \vdots \\ & & A_N & G_N^T \\ \hline G_1 & \cdots & G_N & A_\Gamma \end{bmatrix} \begin{bmatrix} \lambda_1^+ \\ \vdots \\ \lambda_N^+ \\ \hline \lambda_\Gamma^+ \end{bmatrix} + \begin{bmatrix} b_1 \\ \vdots \\ b_N \\ \hline b_\Gamma \end{bmatrix} = \begin{bmatrix} w_1^+ \\ \vdots \\ w_N^+ \\ \hline w_\Gamma^+ \end{bmatrix} \quad (14)$$

$$l_i \leq \lambda_i^+ \leq u_i \quad \forall i = 1 \ldots N$$

$$l_\Gamma \leq \lambda_\Gamma^+ \leq u_\Gamma$$

where the diagonal blocks $A_i = J_i M_i^{-1} J_i^T + C_i$ represent the inverse effective mass of the internal constraints of each subsystem. The interface constraint impulses are arranged in $\lambda_\Gamma^+$, and the internal subsystem constraint impulses in $\lambda_i^+$.

The block $A_\Gamma = J_\Gamma M^{-1} J_\Gamma^T + C_\Gamma$ represents the inverse effective mass of the bodies at the interface, and it does not include any information about the internal topology of the subsystems. Moreover, the coupling blocks $G_i = J_{\Gamma_i} M_i^{-1} J_i^T$ map the internal impulses to the interface velocities, but only including the bodies at the interface (i.e., the bodies that are constrained by $J_{\Gamma_i}$ and $J_i$ at the same time).

From the N top block-rows in Eq. (14), an MLCP for the internal constraints can be formulated for each subsystem as:

$$A_i \lambda_i^+ + G_i^T \lambda_\Gamma^+ + b_i = w_i^+ \quad \} \quad \forall i = 1 \ldots N \quad (15)$$

$$l_i \leq \lambda_i^+ \leq u_i$$

so that the internal impulses $\lambda_i^+$ can be determined in parallel, which contributes significantly to the speedup in a substructuring solver. However, an estimate of the interface impulses $\lambda_\Gamma^+$ is needed. In order to do so, the last block-row of Eq. (14) can be used to formulate the following MLCP:

$$A_\Gamma \lambda_\Gamma^+ + \sum_{i=1}^{N} G_i \lambda_i^+ + b_\Gamma = w_\Gamma^+ \quad \} \quad (16)$$

$$l_\Gamma \leq \lambda_\Gamma^+ \leq u_\Gamma$$

where the internal constraint impulses of the subsystems $\lambda_i^+$ needs to be determined.

One approach could be to perform iterations with Eqs. (15) and (16) until the error in the impulses satisfies a certain tolerance. However, the formulation of the interface dynamics in Eq. (16) only considers the coupling between the bodies at the interface, and the force acting on them. This makes the coupling between subsystems "soft" because the internal dynamics of the subsystem is not represented in the coupling equation (16). Some known methods use this kind of iterative scheme, or force based interface coupling. They usually require large number of iterations to converge, which can be reduced by warm starting the iterations with the impulses computed at the previous time step. However, a different approach is needed when constraints change regularly across time steps, for instance, when new contacts are established.

In accordance with embodiments described herein, the interface dynamics are formulated using the Schur complement method, so that the internal dynamics of the subsystems is taken into account when solving for the interface impulses $\lambda_\Gamma^+$. This is equivalent to substituting the solution of the internal impulses $\lambda_i^+$ from Eq. (15) into Eq. (16). When all subsystem constraints are active, $w_i^+$ in Eq. (15) will be zero, and the MLCP for the interface impulses becomes:

$$S_\Gamma \lambda_\Gamma^+ + z_\Gamma = w_\Gamma^+ \quad \} \quad (17)$$

$$l_\Gamma \leq \lambda_\Gamma^+ \leq u_\Gamma$$

where $$S_\Gamma = A_\Gamma - \Sigma_{i=1}^{N} G_i A_i^{-1} G_i^T \text{ and } z_\Gamma = b_\Gamma - \Sigma_{i=1}^{N} G_i A_i^{-1} b_i. \quad (18)$$

Here, $S_\Gamma$ is the Schur complement of the subsystems in Eq. (14). The matrix of this MLCP includes the inverse effective mass matrix of the subsystems $A_i$, $\forall$ i=1 . . . N. This makes the formulation of the interface dynamics consistent with the subsystem dynamics, which typically translates into the need for performing less coupling iterations than FBIC methods.

If the internal impulses do not have limits (i.e., they are bilateral constraints), Eq. (17) only needs to be solved once because the inverse effective mass of the subsystems $A_i$ does not change. In this case, the computed interface impulses $\lambda_\Gamma^+$ are also a solution of the original problem in Eq. (14), and so they can be used to solve the internal impulses $\lambda_i^+$ in Eq. (15) in one iteration. However, in the general case, the existence of limits for the internal constraint impulses makes it necessary to reformulate the Schur complement.

The Schur Complement for Constraints with Bounds

Knowing if the internal constraints are active or tight is the key to formulating the correct interface dynamics. The Schur complement in Eq. (17) assumes that the internal impulses can take any value, as if they were unbounded. This can be a fair assumption for the active constraints because their impulses have some room to change before they reach a bound. However, tight constraints are at the bounds and their impulse has a well-defined value. Therefore, the tight impulses must be considered as known.

Considering the active and tight constraints separately, the internal constraint impulses of the subsystems can be rearranged as:

$$\lambda_i^+ = \begin{bmatrix} \lambda_{\alpha_i}^+ \\ \lambda_{\tau_i}^+ \end{bmatrix}, \quad \forall i = 1 \ldots N \qquad (19)$$

where $\lambda_{\alpha_i}^+ \in (l_{\alpha_i}, u_{\alpha_i})$ are the active impulses, and $\lambda_{\tau_i}^+ = l_{\tau_i}$ or $u_{\tau_i}$ are the tight impulses at the lower or upper bound. Likewise, the constraint Jacobian matrix can be rearranged as:

$$J_i = \begin{bmatrix} J_{\alpha_i} \\ J_{\tau_i} \end{bmatrix}, \quad \forall i = 1 \ldots N \qquad (20)$$

where $J_{\alpha_i}$ and $J_{\tau_i}$ are the constraint Jacobian matrices of the active and tight constraints, respectively. The MLCP in Eq. (15) for all the subsystems, i=1 ... N, can then be rearranged as:

$$\begin{bmatrix} A_{\alpha\alpha_i} & A_{\alpha\tau_i} \\ A_{\tau\alpha_i} & A_{\tau\tau_i} \end{bmatrix} \begin{bmatrix} \lambda_{\alpha_i}^+ \\ \lambda_{\tau_i}^+ \end{bmatrix} \begin{bmatrix} G_{\alpha_i}^T \\ G_{\tau_i}^T \end{bmatrix} + \lambda_\Gamma^+ + \begin{bmatrix} b_{\alpha_i} \\ b_{\tau_i} \end{bmatrix} = \begin{bmatrix} w_{\alpha_i}^+ \\ w_{\tau_i}^+ \end{bmatrix}, \qquad (21)$$

$$l_i \le \lambda_i^+ \le u_i$$

where all the active constraints satisfy $w_{\alpha_i}^+ = 0$ by Eq. (11). On the other hand, for the tight constraints we can only say that $w_{\alpha_i}^+ 0$ or $w_{\tau_i}^+ 0$, depending on the bound. Therefore, the equations of the active constraints can be written as:

$$A_{\alpha\alpha_i}\lambda_{\alpha_i}^+ + A_{\alpha\tau_i}\lambda_{\tau_i}^+ + G_{\alpha_i}^T\lambda_\Gamma^+ + b_{\alpha_i} = 0. \qquad (22)$$

By substituting the solution of the active impulses $\lambda_{\alpha_i}^+$ from Eq. (22) into Eq. (16), the following modified expression of the Schur complement in Eq. (17) is obtained:

$$S_\Gamma = A_\Gamma - \Sigma_{i=1}^N G_{\alpha_i} A_{\alpha\alpha_i}^{-1} G_{\alpha_i}^T \qquad (23)$$

and $$z_\Gamma = b_\Gamma + \Sigma_{i=1}^N (G_{\tau_i}\lambda_{\tau_i}^+ - G_{\alpha_i} A_{\alpha\alpha_i}^{-1}(b_{\alpha_i} + A_{\alpha\tau_i}\lambda_{\tau_i}^+)). \qquad (24)$$

Here, the effective mass of the subsystems $A_{\alpha\alpha_i}$ is computed using only the active constraints. Moreover, the tight impulses $\lambda_{\tau_i}^+$ are known, which must be at either the lower or upper bound. This is the case of contacts that detach, where the impulse must be zero. Therefore, tight constraints do not transfer the mass like the active constraints do; instead, their impulse is defined by the bounds and they can simply be considered as applied impulses acting on the bodies.

It can be noted that the product inside the summation in Eq. (23) may be computed efficiently using a sparse Cholesky factorization of $A_{\alpha\alpha_i}$. First, one solves $A_{\alpha\alpha_i} K_{\alpha_i} = G_{\alpha_i}^T$ for $K_{\alpha_i}$, and then computes $G_{\alpha_i} K_{\alpha_i}$. The matrix $G_{\alpha_i}$ may be stored using a sparse data structure, which can further improve solver performance.

Substructuring Solver

Our approach uses iterations to determine the index sets $I_\Omega$ of the internal constraints $\Omega$, which determine if they are active or tight. These sets are used to formulate the Schur complement and solve for the interface impulses $\lambda_\Gamma$. Then, the N subsystems can be solved in parallel for the internal impulses $\lambda_i$, which contributes significantly to the performance boost.

Figure 5:
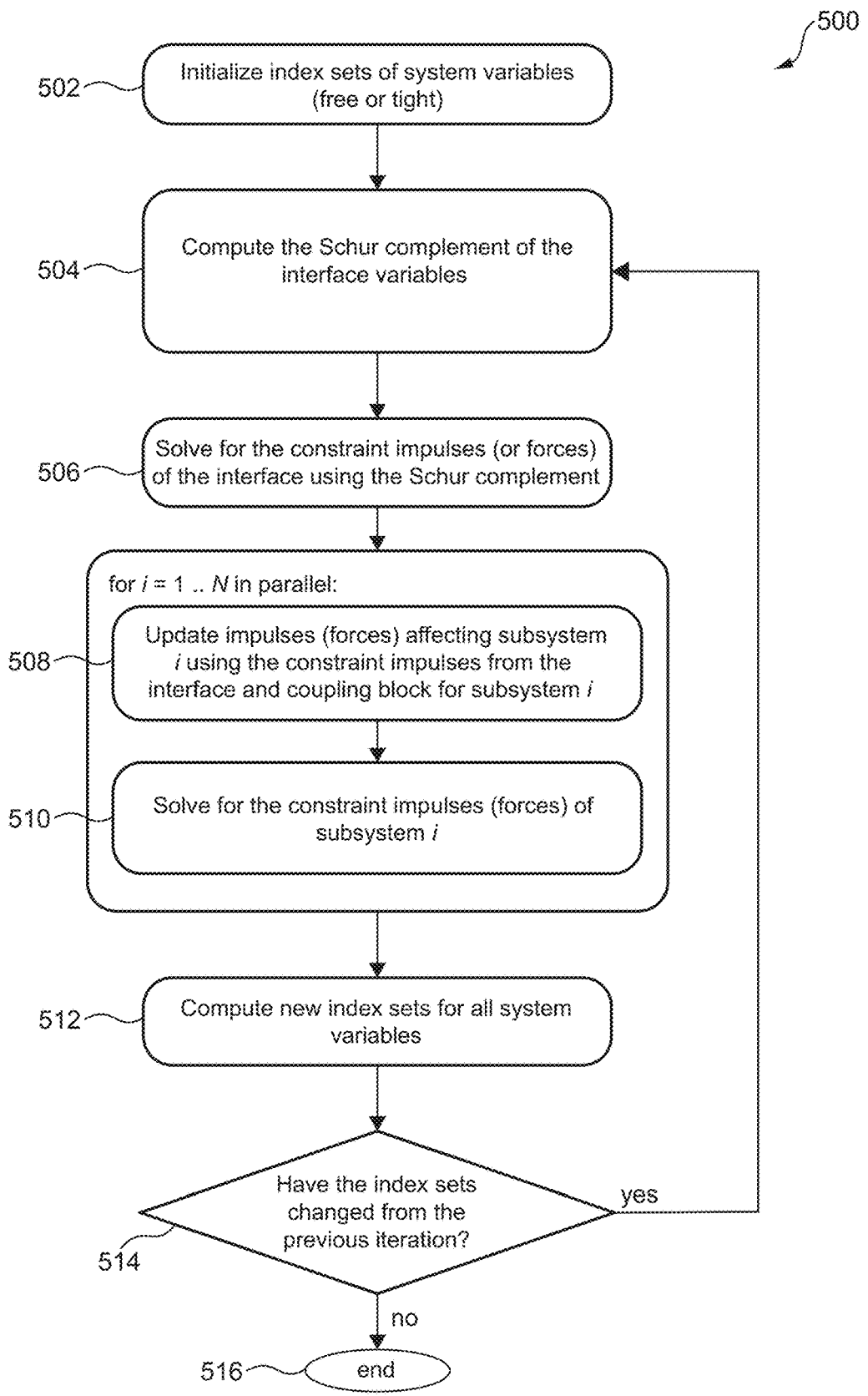
FIGS. 5 and 6 are flow diagrams illustrating acts of a substructuring method in accordance with at least one embodiment.
Figure 6:
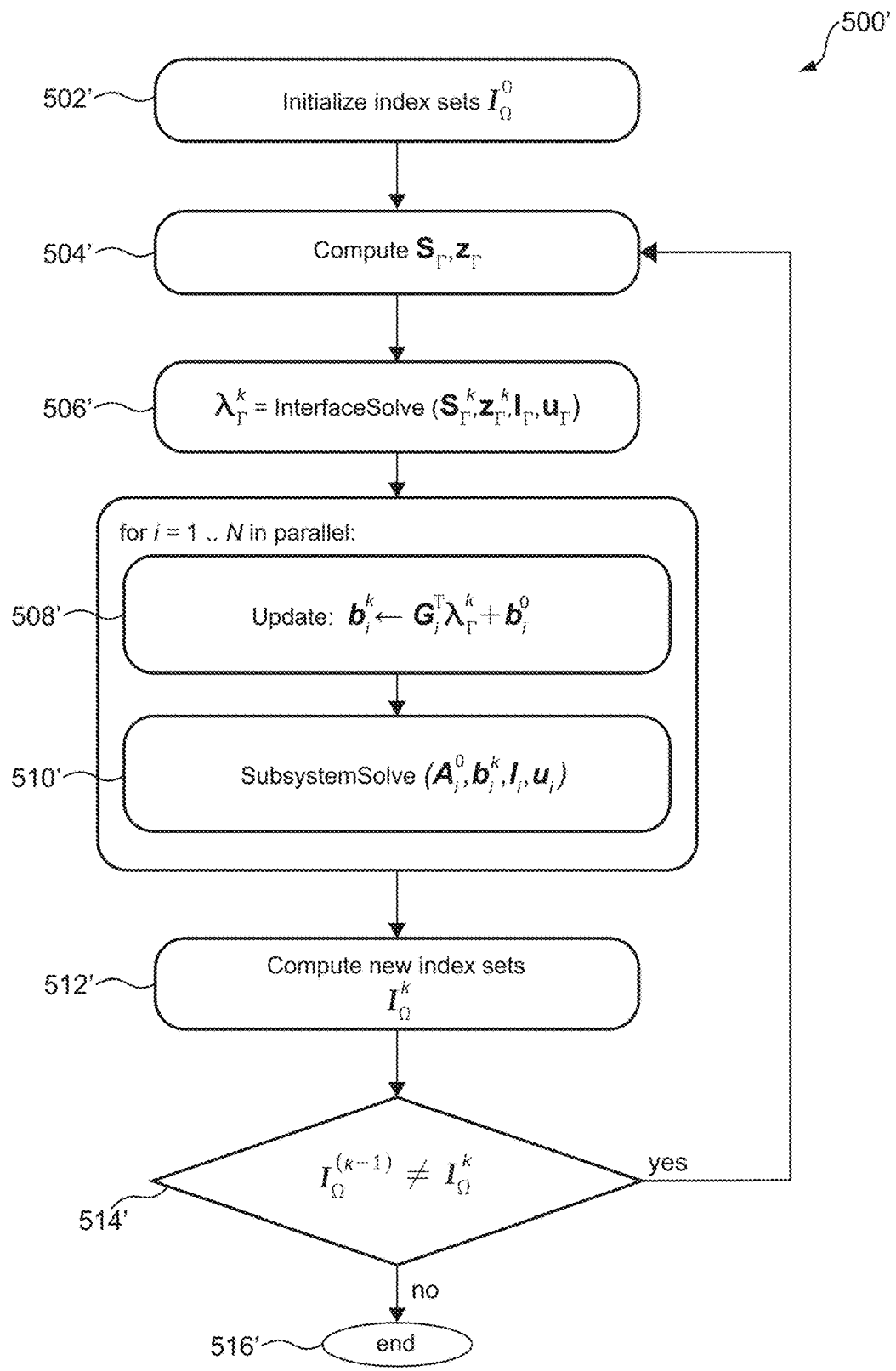

Referring now to FIGS. 5 and 6, there are provided flow diagrams 500, 500' illustrating a substructuring method in accordance with at least one embodiment. FIG. 5 describes an iterative process, as performed by the substructuring solver, for example; FIG. 6 provides assistive detail for FIG. 5 (corresponding acts are indicated with a prime symbol, e.g., 502', 504', etc.) with reference to variables as identified in this description. In one or more embodiments, method 500 (and/or 500') or one or more acts thereof may be performed by one or more computing systems (e.g. computing system 100 of FIG. 1), and in particular, one or more processors thereof. For example, portions of method 500 (and/or 500') may be performed by components of computing system 100. Method 500 (and/or 500') or one or more acts thereof may be embodied in computer-executable instructions that are stored on a computer-readable medium, such as a non-transitory computer-readable medium. It will be understood by persons skilled in the art that some acts or portions thereof in the flow diagrams may be omitted or changed in order in variant implementations.

At 502, the index sets $I_\Omega^0$ are all initialized to active ("free"). However, it is also possible to warm start the solver by using the index sets of the previous time step, as will be discussed.

At 504, at each iteration k, the index sets of the previous iteration $I_\Omega^{k-1}$ are used to form the Schur complement, i.e., $S_\Gamma$ and $z_\Gamma$ in Eqs. (23) and (24). More specifically, the Schur complement of the interface variables are computed by forming the effective inverse mass of each subsystem using only the variables (i.e., matrix rows and columns) that correspond to the free index set.

At 506, the MLCP in Eq. (17) is solved for the interface forces $\lambda_\Gamma^k$ by executing an interface solver (e.g., InterfaceSolve of FIG. 6) as detailed in a subsection to follow.

At 508, the impulses (or forces) affecting each subsystem are updated (e.g., may be done in parallel) using the constraint impulses from the interface and the coupling submatrix for the subsystem.

At 510, the MLCP of each subsystem in Eq. (15) is solved (e.g., may be done in parallel), by executing a subsystem solver (e.g., SubsystemSolve of FIG. 6) as detailed in a subsection to follow, which returns the internal impulses $\lambda_i^k$, $\forall i=1 \ldots N$.

At 512, new index sets $I_\Omega^k$ are updated based on the new impulses. Newly active constraints are added, and newly tight constraints are removed.

At 514, a determination as to whether the index sets have changed from the previous iteration. If the index sets are the same as in the previous iteration, i.e., $I_\Omega^k = I_\Omega^{k-1}$, the method 500 terminates at 516, having computed the solution, which is given by the last computed value of the impulses $\lambda^k$. This is because performing an iteration using the same index sets would give the exact same solution. However, if the index sets are different, the next iteration starts (the flow of method 500 proceeds to 504), and the Schur complement is reformulated using the index sets found in the previous iteration $I_\delta^{k-1}$. It may be noted that any of the impulses computed in one iteration are not used in the next one; only the index sets. Moreover, once the right index sets are determined, the solver can terminate in one iteration. Accordingly, the accuracy of the solver utilizing this method is comparable to other direct methods.

Once the solution is computed (e.g., after 516), the dynamics of a simulation of the multibody system can be advanced. As one application of the embodiments described herein, dynamic simulation is used to drive interactive computer animation. The computer animation causes the computer-based simulator to display images reflecting motion in the simulated multibody system, i.e., how the positions of the objects change from frame to frame. The discrete sequence of frames is provided as output on a graphical display. Time is discretized accordingly using a time step that separates the discrete time points. A frame in the computer animation sequence typically corresponds to one time point, and displays (e.g., graphically renders) the positions of the multibody system objects at that time point. The changes in these positions from one frame to the next can be determined based on integration methods. These require knowledge of the velocity of the objects (body velocities) associated with the current and next time points separated by the time step. As the solution progresses, the positions and velocities in the starting, current, time point are known. The velocities for the next time point can be determined based on Eq. (2), if the constraint impulses are known on the right hand side of that equation. In accordance with the methods described herein, these constraint impulses can be determined in an efficient way.

Interface Solver

A key component of the substructuring approach in at least one embodiment, is the method used to solve for the interface dynamics in the function Inter faceSolve. Recall that if there are contacts at the interface between subsystems, the interface dynamics formulates an MLCP, as shown in Eq. (17). There are many known solvers to solve such a problem, however not all of them are suitable for all applications, especially when dealing with stiff systems that can become ill-conditioned. MLCP solvers to solve for the interface dynamics that may be well-suited to this type of problem include: block principal pivoting (BPP), and projected Gauss-Seidel subspace minimization (PGS-SM).

To better discuss the solution of Eq. (17), note that the MLCP can be rewritten as:

$$\begin{bmatrix} S_{\Gamma\alpha\alpha} & S_{\Gamma\alpha\tau} \\ S_{\Gamma\tau\alpha} & S_{\Gamma\tau\tau} \end{bmatrix} \begin{bmatrix} \lambda_{\Gamma\alpha}^+ \\ \lambda_{\Gamma\tau}^+ \end{bmatrix} + \begin{bmatrix} z_{\Gamma\alpha} \\ z_{\Gamma\tau} \end{bmatrix} = \begin{bmatrix} w_{\Gamma\alpha}^+ \\ w_{\Gamma\tau}^+ \end{bmatrix} \quad (25)$$
$$l_\Gamma \leq \lambda_\Gamma^+ \leq u_\Gamma$$

where $\lambda_{\Gamma\alpha}^+$ and $\lambda_{\Gamma\tau}^+$ are interface impulses in the active and tight set, respectively. Each solver uses different techniques to determine the index sets of the solution, and once they are determined, the value of $\lambda_{\Gamma\tau}^+$ is known. Then, since $w_{\Gamma\alpha}^+ = 0$ by Eq. (11), a linear system for the active variables can be formulated as:

$$S_{\Gamma\alpha\alpha}\lambda_{\Gamma\alpha}^+ = -z_{\Gamma\alpha} - S_{\Gamma\alpha\tau}\lambda_{\Gamma\tau}^+ \quad (26)$$

which can be solved by factorizing the matrix $S_{\Gamma\alpha\alpha}$. Here, two solvers usable for the interface dynamics are described briefly; however, it will be understood that these are provided as non-limiting examples and that other solvers may be employed provided numerical conditions are met (see e.g., subsection on "Other solvers in variant embodiments", below).

PGS with Subspace Minimization (PGS-SM):

PGS-SM method uses a small number of PGS iterations to determine the active and tight sets. Then, a direct linear solve in Eq. (26) is performed in order determine the exact value of the active impulses $\lambda_{\Gamma\alpha}^+$. A Cholesky factorization of $S_{\Gamma\alpha\alpha}$ is used again. If any impulses exceed the bounds, they are projected to the bounds and a new series of PGS iterations are performed. This method shows good convergence for determining the active and tight sets, while it is able to obtain the exact value of the active impulses $\lambda_{\Gamma\alpha}^+$.

Block Principal Pivoting (BPP):

BPP is a direct solver and it uses pivoting to move blocks of variables between active and tight sets, which has the advantage of producing exact solutions. The method tries different sets and solves for the active impulses in Eq. (26) by factorizing the lead matrix $S_{\Gamma\alpha\alpha}$. In each iteration, the impulses $\lambda_{\Gamma\alpha}^+$ that exceed their bounds are moved to the tight set. Moreover, the complementary between tight variables $\lambda_{\Gamma\tau}^+$ and slack variable $w_{\Gamma\tau}^+$ is checked in case they need to be moved to the active set.

Subsystem Solver

Once the interface impulses $\lambda_\Gamma^+$ are computed, they can be used to solve for the internal constraints of each subsystem in parallel. The subsystem dynamics is formulated in Eq. (15) as N MLCPs. Since stiff systems that are highly ill-conditioned are of particular interest, BPP, for example, may be used as a direct method to solve for the internal impulses.

At each pivoting iteration in the BPP, the internal impulses are split in active and tight as in Eq. (21). Since the value of $\lambda_{\tau_j}^+$ is known, and $w_{\alpha_i}^+ = 0$, a linear system for the active constraints can be formulated:

$$A_{\alpha\alpha_i}\lambda_{\alpha_i}^+ = -b_{\alpha_i} - G_{\alpha_i}^T\lambda_\Gamma^+ - A_{\alpha\tau_i}\lambda_{\tau_i}^+ \quad (27)$$

which is solved at each pivoting step. To solve this linear system, the matrix $A_{\alpha\alpha_i}$ needs to be factorized, which is done by a Cholesky decomposition. Interestingly, when the subsystems are solved, the factorization of $A_{\alpha\alpha_i}$ in the last pivoting iteration can be reused to compute the expressions of the Schur complement in Eqs. (23) and (24). This is because the active set found by the BPP solver is the same that is used to determine the effective mass at the interface in Eq. (23). Therefore, the factorized matrix can be stored, for use in the next substructuring iteration.

Convergence

In experimental results, the index sets typically converged within a small number of iterations of the method (FIGS. 5 and 6). Good performance is typically dependent on obtaining an approximation of the interface impulses, such that the solution of the subsystems gives the correct index sets. There exists a large set of possible interface impulses that will give the correct index sets of the internal constraints, and these may all be equally useful as they will make the method terminate in the next iteration. Embodiments of the solver described herein therefore qualifies as a direct solver for substructuring.

Unfortunately, as with other direct methods that use a block pivoting strategy, a proof of convergence is not provided. This is due to cycling in the index sets, which is hard to predict. One strategy to deal with cycling is proposed by Judice and Pires wherein their algorithm switches to a single pivoting strategy after a pre-specified number of pivoting steps, since single pivoting schemes are proven to converge if a solution exists.

A similar strategy in a BPP implementation may be employed. A hash table based on a checksum computed from the index set is used to detect cycles, and if a cycle is detected, it is possible to fall back to single pivoting for a small number of pivoting steps (e.g., 5) before returning to block pivoting.

Solving Ill-Conditioned Systems

One approach when using the Schur complement method is to solve the interface variables using the conjugate gradient method, which avoids having to form the matrix $S_r$. Preliminary experiments suggest the generalized conjugate gradient (GCG) method GCG may be suitable for certain situations, but generally gives poor convergence with the ill-conditioned problems that result from the simulation of stiff systems.

The ill-conditioning is inconvenient for other iterative solvers such as projected Gauss-Seidel (PGS), which exhibits slow convergence. Then, iterative solvers can become completely inefficient, since the amount of iterations needed in order to obtain an accurate solution is extremely large. Direct solvers, on the other hand, behave well under such conditions because the impulses are computed by a linear solve.

Other Solvers in Variant Embodiments

Under certain numerical conditions, other types of solvers, such as generalized conjugate gradient (GCG) may perform satisfactorily for use in solving subsystems. By way of further example, iterative solvers (in contrast to the direct solvers described herein) may be used for cases where low stiffness is sufficient. In addition, the substructuring method can be applied for solving the subsystems themselves, or for solving the interface systems. This would potentially allow for further subdivision in a recursive manner, resulting in further speed up, however at an increase in the cost of computing the effective mass. Careful balancing in the amount of subsystems and recursion levels is needed to achieve best possible performance.

In a broad aspect, with respect to the substructuring method, a system being modeled is split into subsystems, and the individual subsystems and the interfaces are solved separately. As described herein, each subsystem can include a group of elements modeled as rigid bodies. However, in variant embodiments, the method can also be applied if the subsystems include other types of elements, such as soft bodies or fluids. The method that is used to solve an individual subsystem can be different from subsystem to subsystem.

In other words, the method used to solve individual subsystems is not limited to direct solvers, such as the BPP. The direct solvers may be well-suited for simulating operation of heavy equipment and machinery problems, and generally stiff systems with large mass ratios. However, other types of direct solvers or iterative methods (e.g., projected Gauss-Seidl) may be employed in variant embodiments. For instance, other linear solvers might be better suited for other applications (e.g., those involving soft bodies or fluid subsystems).

Subsystem Partitioning

When using substructuring techniques, a potentially important aspect is how to partition the system into smaller subsystems. In the cases which involve systems with a known topology, such as mechanisms, the subsystems usually contain defined parts of the system. For instance, a load lifted by a cable crane can be partitioned so that crane, cable, and load constitute three separate subsystems. However, contact makes partitioning more challenging because it changes the topology of the system by closing and detaching contacts between the bodies. Therefore, a good partitioning strategy is highly desirable for systems where the constraint topology is only determined at runtime, such as piles of bodies with contact.

Semantic Partitioning

In some instances, the dominant coupling effects of a system are determined by bilateral constraints, with only a small number of contacts occurring at runtime. This presents a known topology that does not change much with time, and so fix-sized system partitioning can be very useful. In such cases, it is the task of the user (e.g., operator, administrator) of the computer-based simulation system to define the subsystems, which are usually grouped based on their function in the system or their similarity. This semantic partitioning benefits from considerations which are often intuitive to the user, which can later translate into better numerical performance. For instance, grouping the bodies so that the subsystems present a certain topology, such as a chain or a tree, can reduce the fill-in of the subsystem lead matrix, thus lowering the computational time for each subsystem solver. Moreover, in some cases, it is possible to reduce the number of contacts within the subsystems and have contacts only at the interface, which further simplifies subsystems dynamics. On the other hand, when there is a significant presence of contact in the system, such as in a large pile of bodies, a user-defined partitioning is generally not feasible because the constraint graph topology changes at each time step. Therefore, a method to generate the subsystems based on the topology of the system being modeled can be very useful.

Minimum Degree Partitioning Method

In one broad aspect, there is provided a method based on a heuristic that searches in the connectivity (constraint) graph to find the bodies that are closer to each other. The minimum degree partitioning starts forming groups of bodies by taking the body that has the fewest connections with the others (i.e., it has the minimum degree). This approach is inspired by the Cuthill-McKee algorithm to encourage sparsity by choosing a peripheral body in the constraint graph. Then, adjacent bodies to the group are added based on the body degree in ascending order, so that the bodies with minimum degree are prioritized at each step. Once the number of bodies in the group reaches the maximum number of bodies per subsystem, the method searches again for a starting body using the same criterion, and a new subsystem begins to generate. Essentially, the bodies are regrouped at each time step based upon the connectivity graph so that the bandwidth of the subsystem matrix $A_i$ is minimized.

Figure 7:
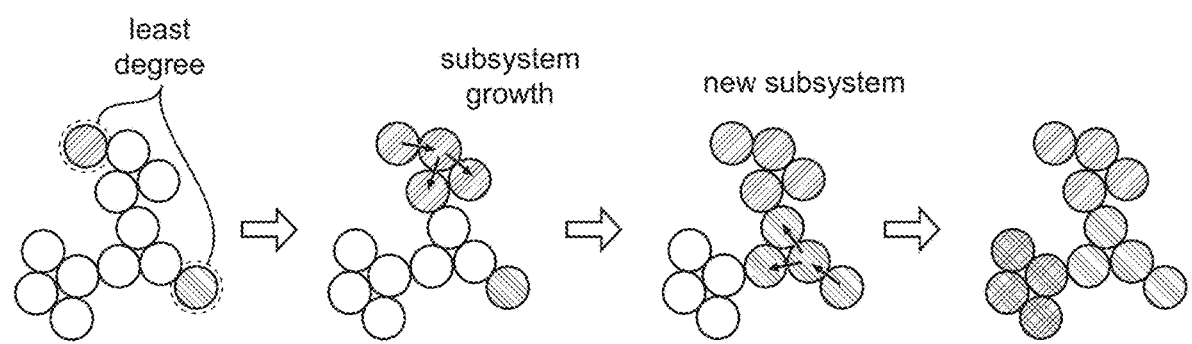
FIG. 7 illustrates an example application of a method of minimum degree partitioning in accordance with at least one embodiment.

FIG. 7 shows, generally as 700, an illustrative example application of this method, in accordance with one embodiment, of performing minimum degree partitioning. At 710, the bodies that have the fewest other bodies in contact with them (minimum degree) are identified. At 720, the subsystem is grown by successively adding bodies adjacent to each body (or subsystem) of minimum degree. At 730, when the maximum number of bodies for a given subsystem (e.g., may be user-defined) is reached, the method starts over again. At 740, the partitioning method completes when the number of bodies (or subsystems) left is small enough to form its own subsystem (e.g., using the same threshold for maximum number of bodies at 730).

Figure 8:
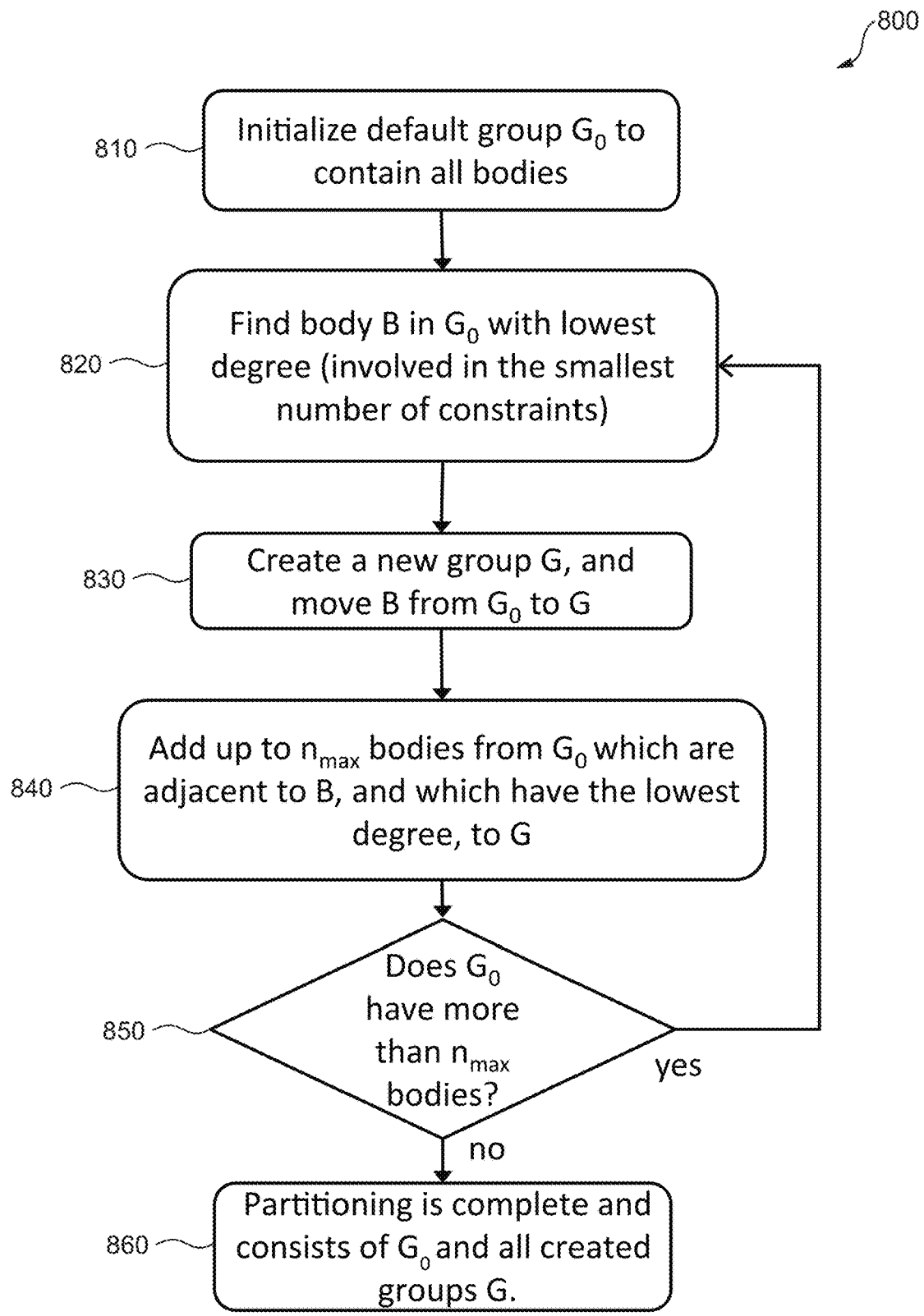
FIG. 8 is a flow diagram illustrating acts of a method of minimum degree partitioning in accordance with at least one embodiment.

FIG. 8 is a flow diagram illustrating a method of minimum degree partitioning in accordance with one embodiment, shown generally as 800. In one or more embodiments, method 800 or one or more acts thereof may be performed by one or more computing systems (e.g. computing system 100 of FIG. 1), and in particular, one or more processors thereof. For example, portions of method 800 may be performed by components of computing system 100. Method 800 or one or more acts thereof may be embodied in computer-executable instructions that are stored on a computer-readable medium, such as a non-transitory computer-readable medium. It will be understood by persons skilled in the art that some acts or portions thereof in the flow diagrams may be omitted or changed in order in variant implementations.

At 810, a default group $\mathcal{G}_0$ containing all the bodies in the system being modeled is created.

At 820, the body $\beta \in \mathcal{G}_0$ with minimum degree (e.g., involved in the smallest number of constraints) is identified. In the event of a tie, the body may be chosen randomly among the potential candidates or some other defined criteria may be applied.

At 830, the body identified at 820 is moved into a newly created group g, and removed from the default group $\mathcal{G}_0$.

The body group grows following the criterion of minimum degree, so that the next chosen body (from $\mathcal{G}_0$) is the adjacent body to the subsystem with minimum degree. In this manner, at 840, bodies are successively added to group g (and removed from $\mathcal{G}_0$) until the number of bodies in the group is equal to the maximum number $n_{max}$, which, for example, can be defined by the user or based on the total number of bodies.

At 850, it is determined whether the default group $\mathcal{G}_0$ contains a greater number of bodies than $n_{max}$. If so, the flow of method 800 returns to 820, after which new, additional groups g will be created; otherwise, the flow of method 800 proceeds to 860 where the method terminates. Upon termination, the partitioning method completes, and the partitioning consists of all created groups g and the default group $\mathcal{G}_0$.

The use of the minimum degree partitioning method of FIG. 8 in combination with an embodiment of the substructuring method previously described provides certain advantages as previously noted, but is optional; other partitioning methods may be employed for use with substructuring methods described herein in a given implementation.

Sample Results

Described herein are sample results from an evaluation of an example implementation of an embodiment of the substructuring methods and systems described herein. Many of the examples involve high mass ratios, stiff constraints, and long kinematic chains. Fixed-point iterative methods usually fail to achieve the same quality as direct solvers in such cases and require many iterations.

In this example implementation, results (see Table 1 below) were obtained using a six-core Intel Core i7 3.3 GHz CPU with hyper-threading enabled. Simulations were performed using a time step of h=1/60s. A Vortex Studio™ physics engine (produced by CMLabs) was used to perform collision detection and to build the constraint Jacobian matrices. Methods for substructuring, constraint solvers, and subsystem partitioning were implemented in C++. The Eigen linear algebra library was used to perform matrix and vector operations. A sparse Cholesky factorization was used to solve the linear systems in Eq. (15) and Eq. (17), as well as to solve for the subsystem matrix $G_i A_i^{-1} G_i^T$.

The performance of the substructuring method was compared against a baseline approach, which was a block principal pivoting (BPP) solver without substructuring. A comparison with the projected Gauss-Seidel (PGS) method, a fixed-point iterative method popular among real-time physics engines, and the force based interface coupling (FBIC) of Lacoursière. With respect to Applicants' methods, the substructuring method described herein was implemented using two solver methods described previously: block principal pivoting (Schur+BPP) and projected Gauss-Seidel with subspace minimization (Schur+PGS-SM).

In order to provide a fair comparison of their runtime performance, each solver was tuned to produce behavior qualitatively similar to the baseline BPP approach. Table 2 provides example parameters, used for each solver across experiments unless otherwise indicated. In the cases of PGS and FBIC, reasonable behavior was often unachievable without allowing a very large number of Gauss-Seidel iterations or coupling iterations. These methods also use warm starting, which initializes the solution with constraint impulses from the previous time step. Substructuring was not used from the BPP and PGS solvers, meaning that the entire system was solved using a single matrix.

A maximum iteration count of 1000 and 250 was used for PGS and FBIC, respectively. Warm starting was also used for both of these solvers, in which the constraints impulses at the previous time step are used as an initial solution for the current time step. However, even with large iterations counts and warm starting, these methods struggled to produce results that match the baseline. Unless otherwise stated, results produced using the substructuring method described herein and FBIC used a multithreaded implementation. The other solvers (BPP and PGS) used a single threaded implementation.

Table 1 below provides the average wall clock time (and speedup factor) when solving the dynamic system, for each example. The average number of coupling iterations and details about the partitioning scheme used for each example are also provided. The fastest method for the log tower example is Schur+PGS SM at 77.4 ms. The fastest method for the cable spinner example is Schur+BPP at 8.7 ms. The fastest method for the chain wrap example is Schur+BPP at 11.6 ms. The fastest method for the chain drop example is Schur+PGS SM at 8.7 ms. The fastest method for the rock pile example is Schur+PGS SM at 117.8 ms. The fastest method for the net with truck example is Schur+BPP at 11.9 ms. The fastest method for the tandem cranes example is Schur+BPP at 12.9 ms. Speedup factors are computed relative to the baseline approach, which is the BPP method without substructuring. Examples with an asterisk (*) regularly reached the maximum number of coupling iterations:

TABLE 1

| Example | BPP | PGS | Schur + BPP | Schur + PGS-SM | FBIC | Average iterations | Partitioning (# bodies) |
|---|---|---|---|---|---|---|---|
| Log tower* | 295.1 ms | 237.9 ms (1.2×) | 83.3 ms (3.5×) | 77.4 ms (3.8×) | 131.5 ms (2.2×) | 7.6 | min. degree (32) |
| Cable spinner | 141.3 ms | 229.1 ms (0.6×) | 8.7 ms (16.2×) | 8.8 ms (16.0×) | 93.2 ms (1.5×) | 2.1 | user defined (48) |
| Chain wrap | 54.6 ms | 198.5 ms (0.3×) | 11.6 ms (4.7×) | 12.3 ms (4.4×) | 132 ms (0.4×) | 4.4 | user defined (16) |
| Chain drop | 46.9 ms | 150.5 ms (0.3×) | 9.1 ms (5.2×) | 8.7 ms (5.4×) | 20.5 ms (2.3×) | 3.6 | user defined (16) |
| Rock pile* | 367.5 ms | 284.4 ms (1.3×) | 127.7 ms (2.9×) | 117.8 ms (3.1×) | 513.9 ms (0.7×) | 7.2 | min. degree (16) |
| Net with truck | 252.3 ms | 802.4 ms (0.3×) | 11.9 ms (21.1×) | 12.7 ms (19.9×) | 632.0 ms (0.4×) | 2.6 | user defined (48) |
| Tandem cranes | 180.6 ms | 222.9 ms (0.81×) | 12.9 ms (13.9×) | 13.0 ms (13.8×) | 134.3 ms (1.3×) | 2.4 | user defined (24-50) |

Table 2 below provides examples of default parameters for each of the solvers used in the experiments, including: the maximum iterations or pivoting steps ($\kappa_{iter}$), maximum number of coupling iterations ($\kappa_{coup}$, the tolerance when computing index set changes ($\eta$), stopping tolerance of iterative methods ($\epsilon$):

TABLE 2

| Solver | $\kappa_{coup}$ | $\kappa_{iter}$ | $\eta$ | $\epsilon$ |
|---|---|---|---|---|
| BPP | — | 50 | $10^{-5}$ | — |
| PGS | — | 1000 | — | $10^{-9}$ |
| Schur + BPP | 10 | 50 | $10^{-5}$ | — |
| Schur + PGS-SM | 10 | 50 | $10^{-5}$ | $10^{-9}$ |
| FBIC | 250 | 50 | $10^{-5}$ | — |

EXAMPLE DESCRIPTIONS

These examples were used in an evaluation of an example embodiment of the substructuring method described herein. FIGS. 9A and 9B show screenshots provided as output (e.g., on a display) of a computer-based simulator for a number of example simulations, shown generally as 900. The example simulations depicted in FIGS. 9A and 9B include a cable spinner (910), chain drop (920), chain wrap (930), net with truck (940), rock pile (950), tandem cranes (960), log tower (970), anchor handling (980), and a port crane (990). Constraint compliances used to regularize the multibody system (i.e., diagonal values of C) range from $10^{-7}$ to $10^{-10}$. The examples involve mass ratios up to 40,000:1.

It will be understood that a number of these examples are provided for illustration purposes; other examples and applications that stand to benefit from the methods described herein are possible, including without limitation: heavy equipment training, vehicle dynamics simulation, robotics training, robotic grasping, etc.

Cable Spinner (910):

A complex system involving 8 flexible cables is used to suspend a 10 kg plate and 2500 kg ball. Each cable consists of cable links (0.1 kg each) coupled to neighboring links using a joint with 6 degrees of freedom that is nearly inextensible, but allows bending and torsional motion. More generally, examples of light cables with heavy loads are present in many scenarios with heavy machinery, such as cranes. Furthermore, tangled cables can be challenging to simulate due to self-contact as well as contact between cables. Substructuring allows for the simulation of each cable section individually, while keeping the coupling between them through contact.

Chain Drop (920):

A stiff chain consisting of 250 links (0.25 kg each) is dropped onto an inclined plane. Each link is connected by a universal joint, and the chain is partitioned into groups of bodies of size 32. The friction coefficient is low enough so that the chain slowly slides off the plane. This example evaluates the ability of the methods described herein to handle coupling between subsystems when many friction variables are sliding (tight).

Chain Wrap (930):

A stiff chain consisting of 100 links (0.25 kg each) is used to support a massive box (500 kg). Each neighboring link is coupled by a universal joint, with the last link coupled to the box. A user-defined partitioning is used to create subsystems of each sequential grouping of 12 bodies.

Net with Truck (940):

A dump truck is dropped onto a web of cables. The cables have high stiffness, but very small mass (0.2 kg per body). Each section of cable is a partition consisting of 48-65 bodies and more than 280 constraints per partition. The truck (8000 kg) is a separate partition consisting of 22 bodies and more than 120 constraints. A user-defined partitioning is used to decompose the simulation so that the truck constitutes one subsystem, and each cable section is one subsystem. Exceptionally, a maximum iteration count of 1000 was needed with this example when using the FBIC method. This type of test illustrates a challenging simulation scenario where some of the interacting objects have masses that are at least one order of magnitude larger than that of the other elements. Also, large tensile forces are induced in the thin cables that connect some of the massive objects. Some other cases that this example might extend to can include, for instance and without limitation: the modeling and simulation of trains, and systems of vehicles that may collide with each other or move on suspended roads and bridges. In variant implementations, this type of simulation may also have applicability to the generation of special effects (e.g., for films).

Rock Pile (950):

A large pile of rocks (masses ranging from 80-250 kg) is pushed by a stiff, lightweight shovel (1 kg). The constraint connectivity of the system is not known a priori. Partitions are created using the minimum degree partitioning method described earlier.

Tandem Cranes (960):

Two cranes (approx. 75,000 kg each) lift a heavy pipe (3500 kg) that is suspended in the air. Each crane consists of several subsystems which include: the cable systems, vehicle track and drivetrain, boom and hoist articulation, and hooking mechanisms. The pipe is given an initial velocity to cause a reaction that results in sliding motion.

Log Tower (970):

This example involves 160 logs (50 kg each) stacked vertically with a 2500 kg box dropped on top. Partitions are created using the minimum degree partitioning method described earlier, and the partitions change at each time step. The stack is initially stable, but is perturbed when a rolling ball collides with the base of the stack that causes it to collapse. This type of test, involving numerous bodies, illustrates performance of the minimum degree partitioning method when the topology of the system is completely unknown a priori. Accordingly, substructuring may be used with such collections (e.g., piles) of bodies when they are either organized (e.g., building a tower) or disorganized (e.g., simulating a tower collapsing).

Anchor Handling (980):

An oil platform is anchored by multiple long chains (at least 1000 m) and heavy anchors (15000 kg each) to the sea bed and subject to wave motion. Chain links (over 500 links in each chain) are simulated to ensure realistic behavior. A ship uses a cable attached to the chain with a ring around the chain to lift the anchor. The ring slides along the chain and is lowered from the top of the chain towards the anchor, to lift the anchor and enable the winching of the anchor chain onto the platform.

Port Crane (990):

A port crane (approximately 15000 kg each) lifts multiple containers (10000 to 20000 kg each) at the same time using a complex spreader attachment. The spreader is attached to the crane using multiple (e.g., 10) cable systems with pulleys (about 60), each composed of many rigid bodies, to accurately model the cable flexibility and dynamics effects.

Experimental Performance

A summary of timing information and speedup factors for each solver for some of the foregoing examples were presented in Table 1. The Schur+BPP implementation typically gave best performance. However, for the log tower and rock pile examples, Schur+PGS-SM gave slightly better performance. These example involve complex contact between a large number of bodies, which indicates that PGS-SM may be better suited to solve the interface constraints in such cases.

It was also observed that although a benefit of the methods described herein can be that the workload of simulating constrained multibody systems is shareable across multiple processor units, single threaded implementations may also benefit from the methods. The approach can also benefit from using the index set of the constraints from the previous time step (a type of warm starting) in variant implementations.

With respect to partitioning, in evaluation, an embodiment of the partitioning methods (see e.g., FIG. 8) was parameterized by the maximum number of bodies per partition. The effect of this parameter was evaluated by measuring the performance of the simulation and sweeping multiple values of the parameter. Some results are shown in Table 3, which provides the average solve time and average partition count for examples using the minimum degree partitioning method. The performance of the substructuring method varied with the number of bodies per partition. For the log tower example, the parameters associated with the fastest average solve time were a maximum of 16 bodies per partition, a 77.4 ms average solve time, and an average partition count of 29.3. For the rock pile example, the parameters associated with the fastest average solve time were a maximum of 32 bodies, a 117.8 ms average solve time, and an average partition count of 17.9.

TABLE 3

| Example | # bodies | avg. solve time | avg. partitions |
| --- | --- | --- | --- |
| Log tower | 8 | 86.7 ms | 40.4 |
|  | 16 | 77.4 ms | 29.3 |
|  | 32 | 94.5 ms | 23.7 |
|  | 64 | 117.6 ms | 21.4 |

TABLE 3-continued

| Example | # bodies | avg. solve time | avg. partitions |
| --- | --- | --- | --- |
| Rock pile | 8 | 246.9 ms | 33.9 |
|  | 16 | 169.8 ms | 27.4 |
|  | 32 | 117.8 ms | 17.9 |
|  | 64 | 172.8 ms | 17.8 |

Accordingly, the size of the subsystems (and total number of subsystems) appears to have an effect on the performance of the substructuring method. Preferably, the number of partitions would match the number of available processing units. However, where a Cholesky factorization is computed at each step, large subsystems can adversely affect the performance. Therefore, the number of partitions is a parameter that should be tuned for optimal performance.

Additional Details

Solving multibody systems can be challenging when they involve large numbers of bodies, and complex systems of constraints. Unilateral contact, friction, and bilateral constraints with limits can make the problem particularly difficult. Additional numerical issues arise in systems with widely varying masses, singular configurations, and redundant constraints. For stiff, poorly conditioned systems, direct methods are desirable to ensure accurate solutions, but direct methods typically do not scale well as systems become large.

In accordance with one broad aspect, there is provided a novel and non-obvious substructuring method for the efficient solution of large multibody systems involving unilateral constraints. Direct methods are used to solve both the subsystems and the interface, which produces high-quality solutions. Subsystem solves are trivially parallelized, while solving the interface using the effective mass of subsystems provides an efficient means of resolving accurate subsystem interaction forces.

In another aspect, a simulation in accordance with at least some embodiments of a substructing method described herein can be performed on a single machine with multiple cores. However, it will be understood by persons skilled in the art that the processing tasks of the simulation may be split among multiple computing devices, and certain data may be exchanged between computing devices over a wired or wireless network.

In variant embodiments, use of a heterogeneous combination of solver methods is possible. In other words, the solver could be selected based on the characteristics of each subsystem. For instance, PGS may be used if approximate solutions are suitable for a particular subsystem. Integration with embodiments method described herein will typically require adding an extra step to compute the Cholesky decomposition of the $A_{\alpha\alpha_i}$ matrix once the iterative algorithm has converged.

In variant embodiments, the substructuring method may be applied recursively.

In variant embodiments, the substructuring method can be applied to domains other than multibody simulation (e.g., where performing iterations and restarting a simulation is possible), such as finite element simulation or fluid simulation.

While certain methods with respect to certain embodiments have been described and shown with reference to particular acts performed in a particular order, it will be understood that the acts may be combined, sub-divided, or re-ordered without departing from the teachings herein. At least some acts may be executed in parallel or in series.

Accordingly, the order and grouping of the acts is not a limitation of the present technology.

As used herein, the wording "and/or" is intended to represent an inclusive-OR. For example, "X and/or Y" is intended to mean X, or Y, or both. As a further example, by extension, "X, Y, and/or Z" is intended to mean X, or Y, or Z, or any combination thereof.

The present disclosure makes references to a number of embodiments. However, it will be understood by persons skilled in the art that other variants and modifications are possible.

What is claimed is:

1. A computer-implemented method for executing a simulation of a multibody system, the method comprising:
   using a physics-based simulator, that includes at least one processor and memory and is configured to simulate the multibody system, wherein the simulating comprises:
   partitioning the multibody system into a plurality of subsystems in which the multibody system comprises bilateral and unilateral constraints and friction forces and defining a set of interfaces that couple at least two of the subsystems; and
   at each time step of a plurality of time steps performing at least one iteration that includes:
      determining an index set that identifies a set of active constraints in the plurality of subsystems in which the set of active constraints is usable in a formulation of dynamic equations for the set of interfaces;
      at each interface of the set of interfaces, computing an effective mass that accounts for at least a subset of bodies of the plurality of subsystems and for at least a portion of a topology and of an interconnectivity structure between the bodies of the plurality of subsystems;
      solving the dynamic equations of each interface of the set of interfaces and computing at least one interface impulse for each interface using the effective mass; and
      solving dynamic equations of each of the plurality of subsystems to obtain a plurality of internal impulses,
   wherein, for at least a subset of the plurality of time steps, the simulating outputs a sequence of images that visually represent simulated positions and orientations of objects of the multibody system based, at least in part, on the obtained internal impulses.

2. The method of claim 1, wherein at the computing the effective mass, the effective mass accounts for all bodies of the plurality of subsystems, a complete topology, and a complete interconnectivity structure between the bodies of the plurality of subsystems.

3. The method of claim 1, wherein at least one of the plurality of subsystems is solved in parallel with at least one other of the plurality of subsystems by the at least one processor, at each time step.

4. The method of claim 1, wherein a Schur complement method is used in the formulation of dynamic equations for the set of interfaces.

5. The method of claim 1, further comprising using a Schur complement method in the formulation of dynamic equations for the set of interfaces that comprises:
   computing the effective mass at each interface of the set of interfaces by forming the inverse effective mass of each of the plurality of subsystems; and
   solving for the at least one interface impulse.

6. The method of claim 5, wherein for each time step over the at least one iteration thereof, the solving for the at least one interface impulse and the solving each of the plurality of subsystems are alternatingly performed.

7. The method of claim 5, wherein at least one of the solvers selected from the following group is used to solve for the at least one interface impulse: block principal pivoting, projected Gauss-Seidel with subspace minimization.

8. The method of claim 1, wherein the simulating further comprises identifying one or more indices for the set of active constraints, and generating at least one index set of internal subsystem constraints for computing the effective mass at each interface.

9. The method of claim 8, wherein for each iteration of the at least one iteration, the simulating further comprises:
   generating one or more new index sets of internal subsystem constraints;
   wherein at the iteration, one or more index sets generated in a previous iteration are used to compute the effective mass at the plurality of interfaces.

10. The method of claim 9, wherein for a given time step, the solving each interface and the solving each of the plurality of subsystems terminate when the new index sets are unchanged from the one or more index sets generated in the previous iteration.

11. The method of claim 1, wherein the partitioning the multibody system into a plurality of subsystems comprises executing a minimum degree partitioning method.

12. The method of claim 1, wherein the partitioning the multibody system into a plurality of subsystems is performed using semantic partitioning.

13. The method of claim 1, wherein the multibody system comprises a stiff multibody system.

14. The method of claim 1, wherein the simulation of the multibody systems is performed by the physics-based simulator for an equipment training simulation.

15. The method of claim 1, wherein the simulation of the multibody systems is performed by the physics-based simulator for a robotics simulation.

16. The method of claim 1, wherein the simulation of the multibody systems is performed by the physics-based simulator for a virtual reality application.

17. The method of claim 1, wherein the simulation of the multibody systems is performed by the physics-based simulator for an engineering design application.

18. A computer-implemented system for executing a simulation of a multibody system, the computer-implemented system including a physics-based simulator, comprising:
   at least one processor;
   a non-transitory computer-readable medium comprising control logic which, upon execution by the at least one processor, causes the physics-based simulator to simulate the multibody system by:
   partitioning the multibody system into a plurality of subsystems, wherein the multibody system comprises bilateral and unilateral constraints and friction forces, and defining a set of interfaces that couple at least two of the subsystems; and
   at each time step of a plurality of time steps performing at least one iteration that includes:
      determining an index set that identifies a set of active constraints in the plurality of subsystems in which the set of active constraints is usable in a formulation of dynamic equations for the set of interfaces;
      at each interface of the set of interfaces, computing an effective mass that accounts for at least a subset of bodies of the plurality of subsystems and for at least a portion of a topology and of an interconnectivity structure between the bodies of the plurality of subsystems;

solving the dynamic equations of each interface of the set of interfaces and computing at least one interface impulse for each interface using the effective mass; and solving dynamic equations of each of the plurality of subsystems to obtain a plurality of internal impulses, wherein, for at least a subset of the plurality of time steps, the simulating outputs a sequence of images that visually represent simulated positions and orientations of objects of the multibody system based, at least in part, on the obtained internal impulses.

19. A non-transitory computer-readable medium comprising control logic which, upon execution by a processor, causes:

a physics-based simulator engine to simulate a multibody system by:

partitioning the multibody system into a plurality of subsystems, wherein the multibody system comprises bilateral and unilateral constraints and friction forces, and defining a set of interfaces that couple at least two of the subsystems; and at each time step of a plurality of time steps, each time step comprising performing at least one iteration that includes:

determining an index set that identifies a set of active constraints in the plurality of subsystems in which the set of active constraints is usable in a formulation of dynamic equations for the set of interfaces;

at each interface of the set of interfaces, computing an effective mass that accounts for at least a subset of bodies of the plurality of subsystems and for at least a portion of a topology and of an interconnectivity structure between the bodies of the plurality of sub systems;

solving the dynamic equations of each interface of the set of interfaces, and computing at least one interface impulse for each interface using the effective mass; and solving dynamic equations of each of the plurality of subsystems to obtain a plurality of internal impulses, wherein, for at least a subset of the plurality of time steps, the simulating outputs a sequence of images that visually represent simulated positions and orientations of objects of the multibody system based, at least in part, on the obtained internal impulses.

* * * * *

UNITED STATES PATENT AND TRADEMARK OFFICE
CERTIFICATE OF CORRECTION

PATENT NO. : 11,170,143 B2
APPLICATION NO. : 16/165503
DATED : November 9, 2021
INVENTOR(S) : Peiret Gimenez et al.

Page 1 of 1

It is certified that error appears in the above-identified patent and that said Letters Patent is hereby corrected as shown below:

In the Claims

Column 33, Claim 19, Lines 25-27 should read --at each time step of a plurality of time steps performing at least one iteration that includes:--

Signed and Sealed this
Twenty-eighth Day of December, 2021

Drew Hirshfeld
*Performing the Functions and Duties of the
Under Secretary of Commerce for Intellectual Property and
Director of the United States Patent and Trademark Office*